US011664431B2

(12) United States Patent
Brun et al.

(10) Patent No.: US 11,664,431 B2
(45) Date of Patent: May 30, 2023

(54) RING TRANSISTOR STRUCTURE

(71) Applicant: Taiwan Semiconductor Manufacturing Co., Ltd., Hsin-Chu (TW)

(72) Inventors: Aurelien Gauthier Brun, Hsin-Chu (TW); Chun Lin Tsai, Hsin-Chu (TW); Jiun-Lei Jerry Yu, Zhudong Township (TW); Po-Chih Chen, Hsinchu (TW); Yun-Hsiang Wang, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/144,671

(22) Filed: Jan. 8, 2021

(65) Prior Publication Data
US 2022/0223699 A1 Jul. 14, 2022

(51) Int. Cl.
*H01L 29/417* (2006.01)
*H01L 29/40* (2006.01)
(Continued)

(52) U.S. Cl.
CPC ...... *H01L 29/41758* (2013.01); *H01L 29/401* (2013.01); *H01L 29/402* (2013.01); *H01L 29/4238* (2013.01); *H01L 29/7786* (2013.01)

(58) Field of Classification Search
CPC ............. H01L 29/41758; H01L 29/401; H01L 29/402; H01L 29/4238; H01L 29/7786; H01L 29/1066; H01L 29/2003; H01L 29/41766; H01L 27/085; H01L 21/8252; H01L 29/66462
See application file for complete search history.

(56) References Cited

U.S. PATENT DOCUMENTS 5,838,050 A * 11/1998 Ker ..................... H01L 27/092
257/377
5,852,315 A * 12/1998 Ker ..................... H01L 29/0692
257/E29.12
(Continued)

FOREIGN PATENT DOCUMENTS

WO WO-2012157480 A1 * 11/2012 ........... H01L 29/402

OTHER PUBLICATIONS

Efthymiou et al. "On the Physical Operation and Optimization of the p-GaN Gate in Normally-Off GaN HEMT Devices." Appl. Phys. Lett. 110, 123502 (2017),published on Mar. 8, 2017.
(Continued)

*Primary Examiner* — Shahed Ahmed
*Assistant Examiner* — Khatib A Rahman
(74) *Attorney, Agent, or Firm* — Eschweiler & Potashnik, LLC

(57) ABSTRACT

The present disclosure relates to a transistor device. The transistor device includes a plurality of first source/drain contacts disposed over a substrate. A plurality of gate structures are disposed over the substrate between the plurality of first source/drain contacts. The plurality of gate structures wrap around the plurality of first source/drain contacts in a plurality of closed loops. A second source/drain contact is disposed over the substrate between the plurality of gate structures. The second source/drain contact continuously wraps around the plurality of gate structures as a continuous structure.

20 Claims, 19 Drawing Sheets

(51) Int. Cl.
*H01L 29/423* (2006.01)
*H01L 29/778* (2006.01)

(56) References Cited

U.S. PATENT DOCUMENTS

| | | |
|---|---|---|
| 2014/0353736 A1 | 12/2014 | Tanimoto |
| 2015/0295072 A1* | 10/2015 | Rezanezhad Gatabi ..................... H01L 29/423 257/29 |
| 2016/0111501 A1* | 4/2016 | Chen ................. H01L 29/42376 257/192 |
| 2017/0077276 A1* | 3/2017 | Suzuki .............. H01L 29/41758 |
| 2017/0271492 A1* | 9/2017 | Chiu ................... H01L 29/7784 |
| 2017/0278961 A1 | 9/2017 | Hill et al. |
| 2017/0345920 A1* | 11/2017 | Nagahisa .......... H01L 29/41758 |
| 2018/0019332 A1* | 1/2018 | Jeon ..................... H01L 23/585 |
| 2018/0151713 A1* | 5/2018 | Joh ..................... H01L 29/0646 |
| 2019/0067432 A1* | 2/2019 | Fujimaki ........... H01L 29/78618 |
| 2020/0091332 A1* | 3/2020 | Hata ................... H01L 29/4238 |
| 2021/0083085 A1* | 3/2021 | Chang ................. H01L 29/7787 |
| 2021/0296452 A1* | 9/2021 | Hanson .............. H01L 29/7787 |

OTHER PUBLICATIONS

Coates, Eric. "Depletion Mode MOSFET." Published on Aug. 18, 2007.

Baek et al. "Suppresion Technique o Subthreshold Hump Effect for High-Voltage MOSFET." Journal of Semiconductor Technology and Science, vol. 13, No. 5, Oct. 2013.

* cited by examiner

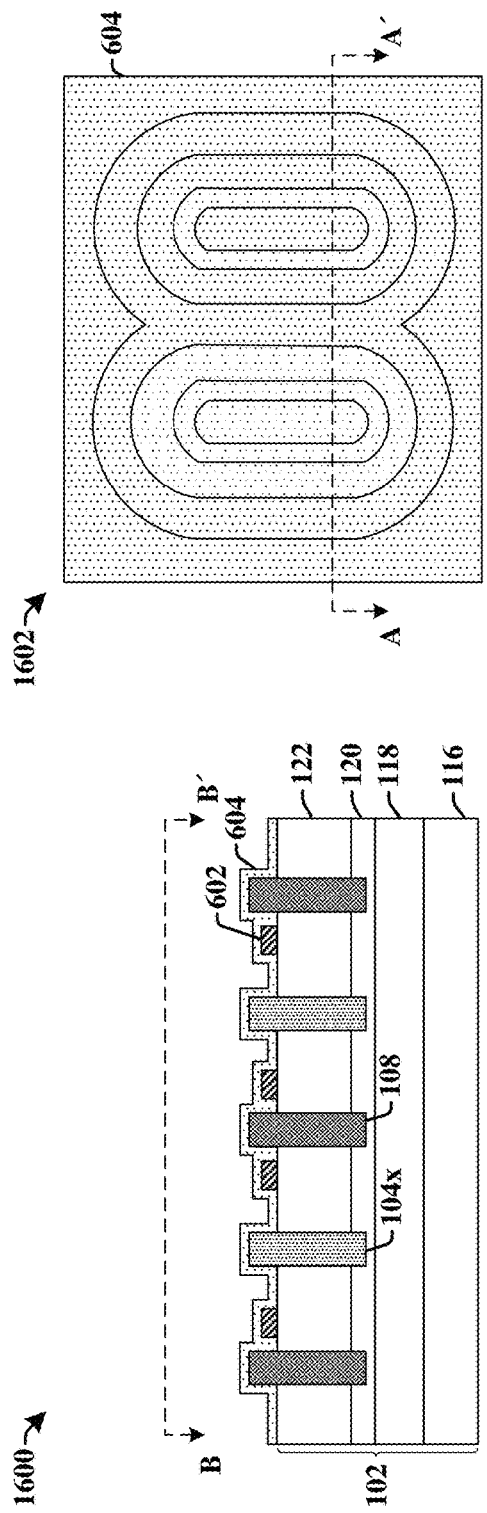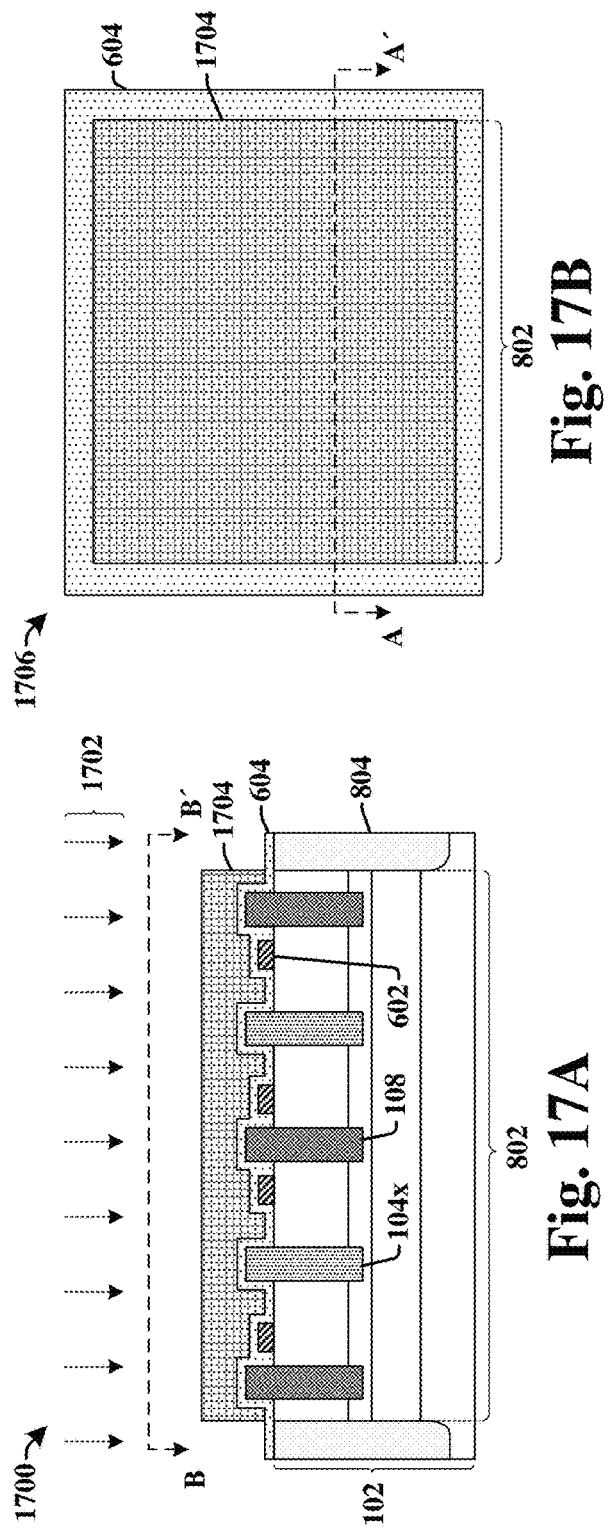

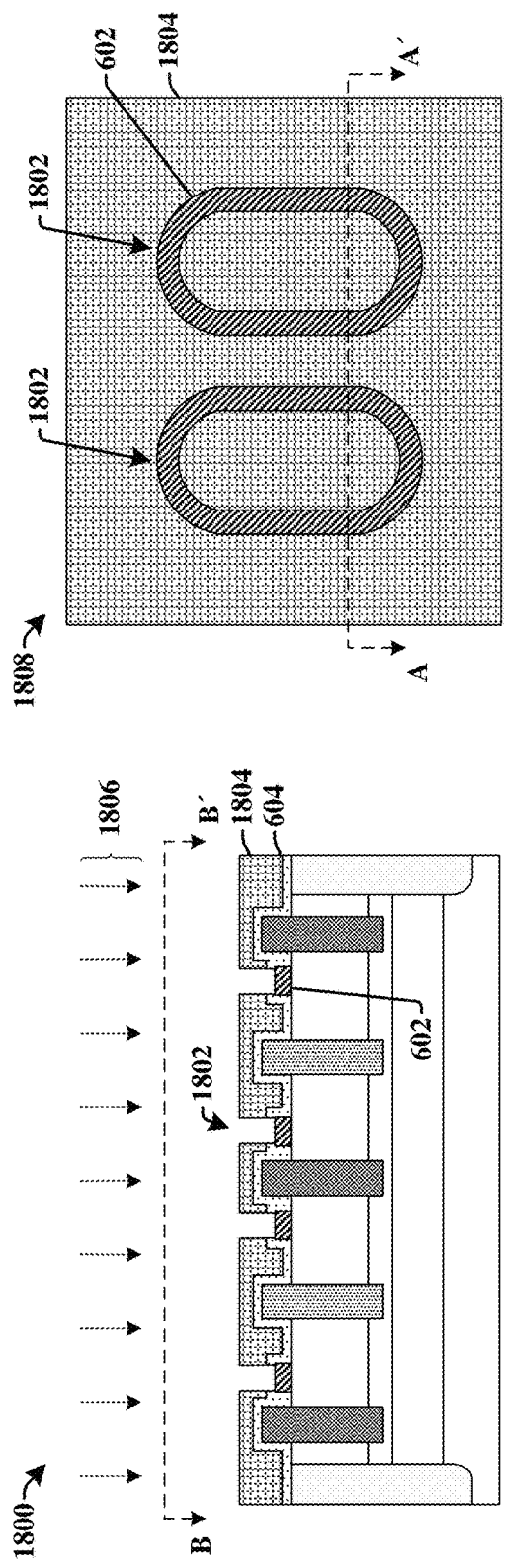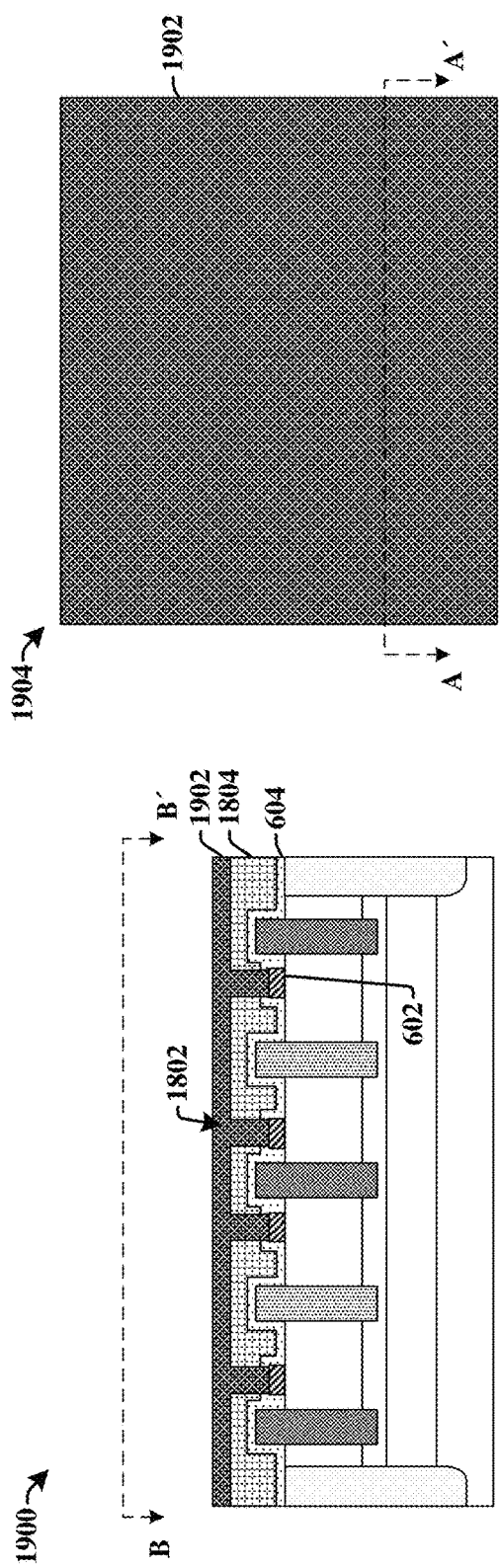
Fig. 18B
Fig. 19B
Fig. 18A
Fig. 19A

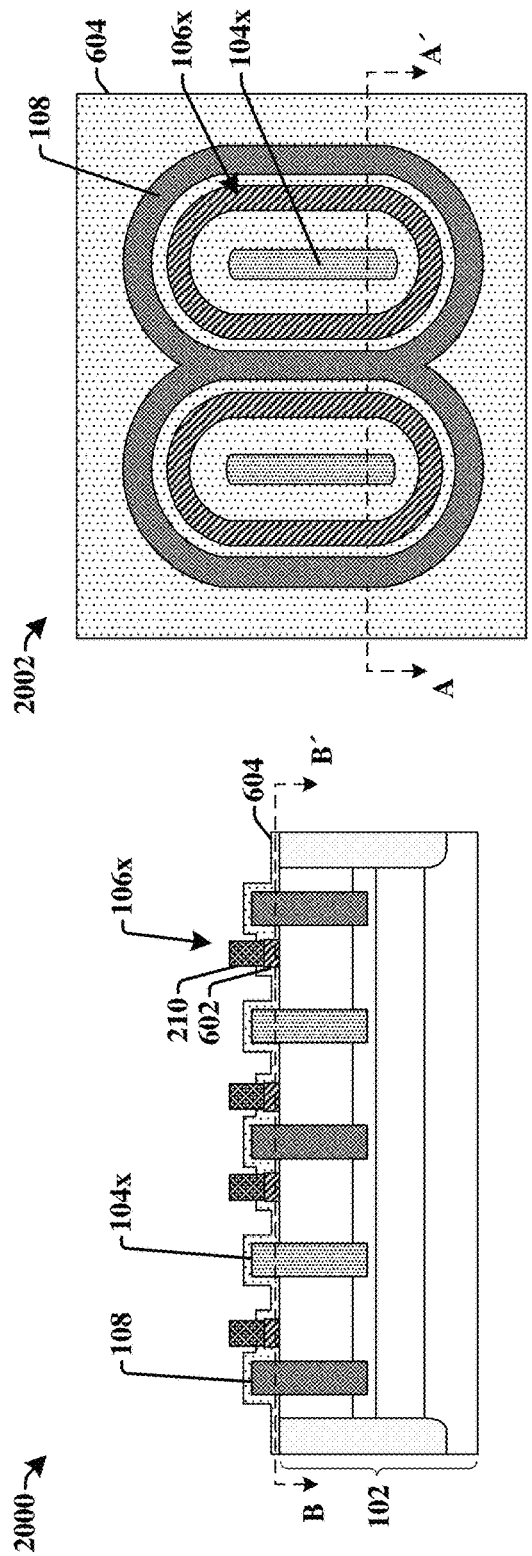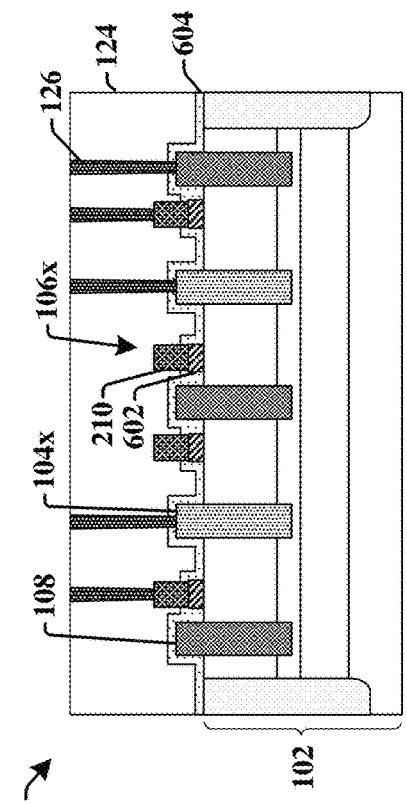
Fig. 20A
Fig. 20B
Fig. 21

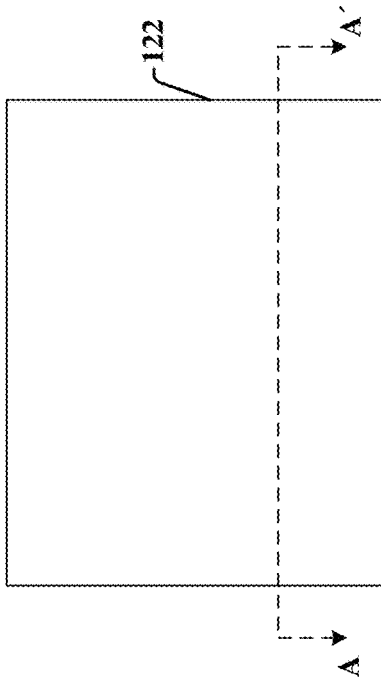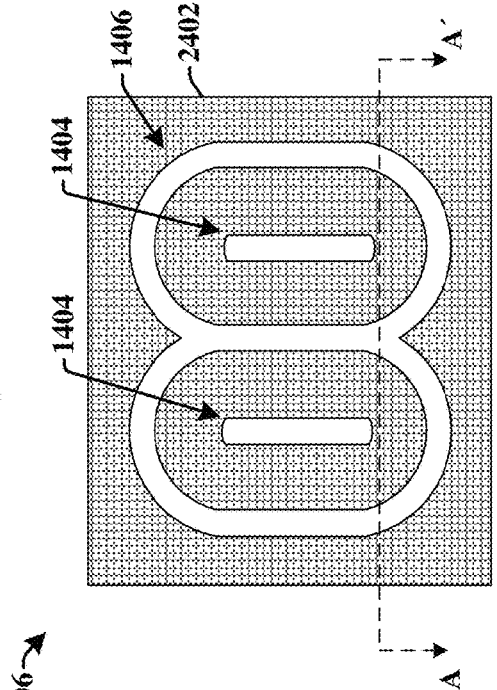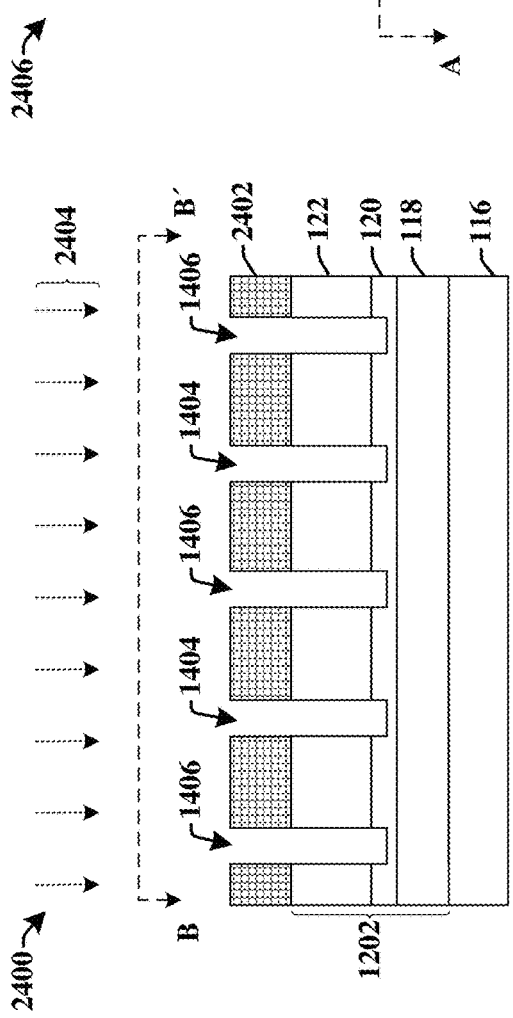

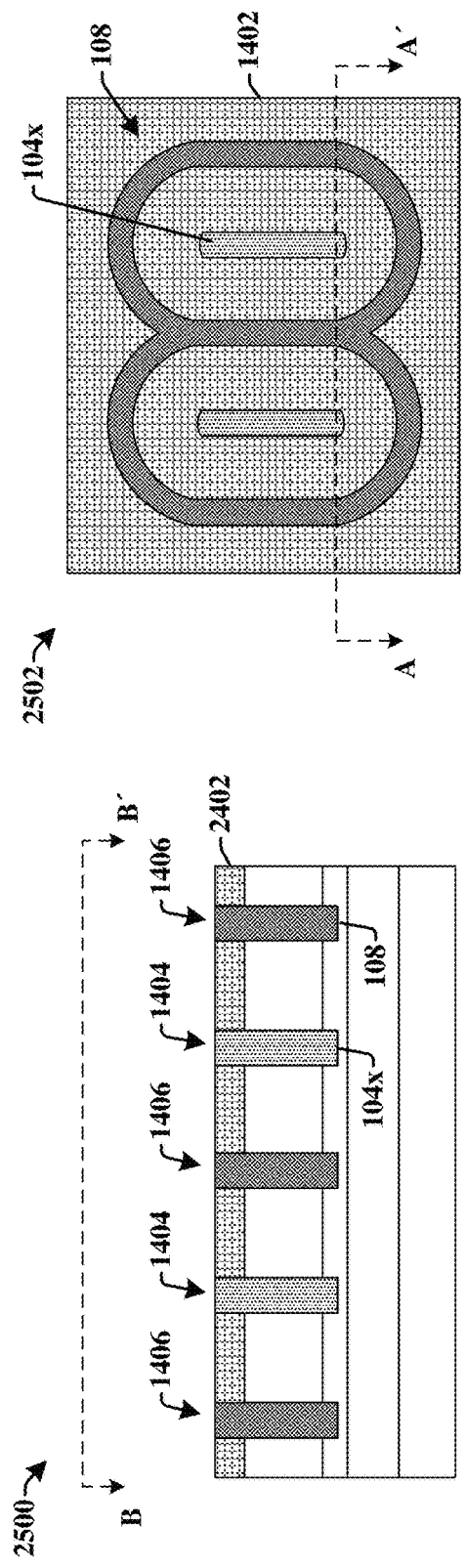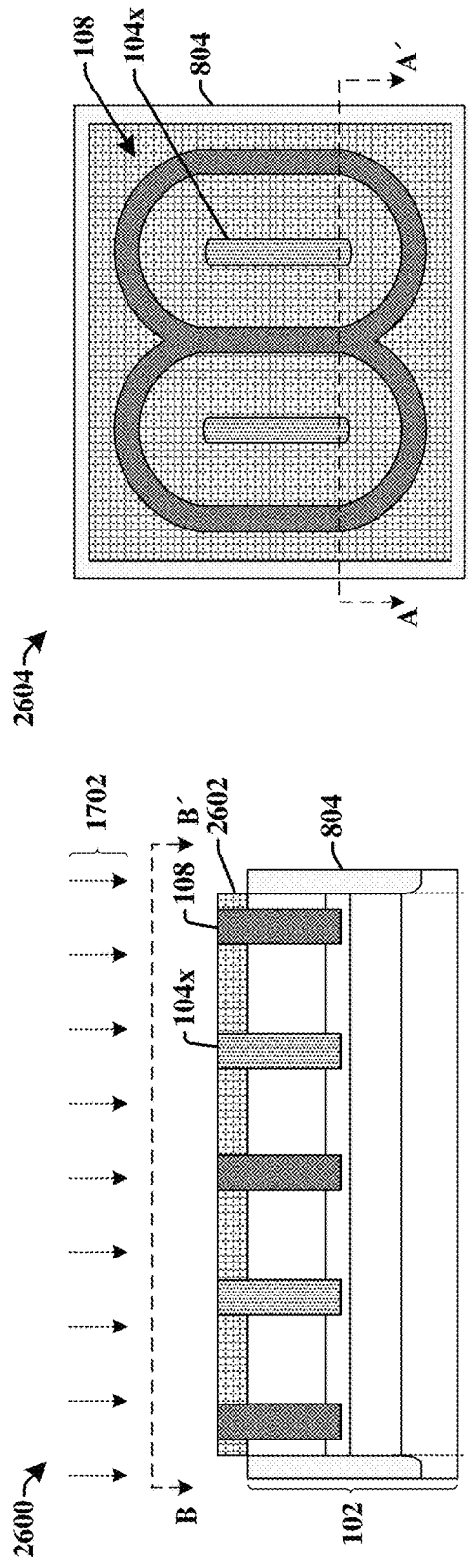

RING TRANSISTOR STRUCTURE

BACKGROUND

Modern day integrated chips comprise millions or billions of transistor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers for RF transmission/receiving chains due to their ability to handle high breakdown voltages (e.g., greater than about 50V) and high frequencies. High voltage devices are also used in power management integrated circuits, automotive electronics, sensor interfaces, flat panel display driver applications, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 12A-21 illustrate some embodiments of a method of forming an integrated chip having a HEMT device comprising gate structures wrapped around first source/drain contacts.

FIGS. 23A-29 illustrate some embodiments of a method of forming an integrated chip having a MISFET device comprising gate structures wrapped around first source/drain contacts.

DETAILED DESCRIPTION

Figure 1A:
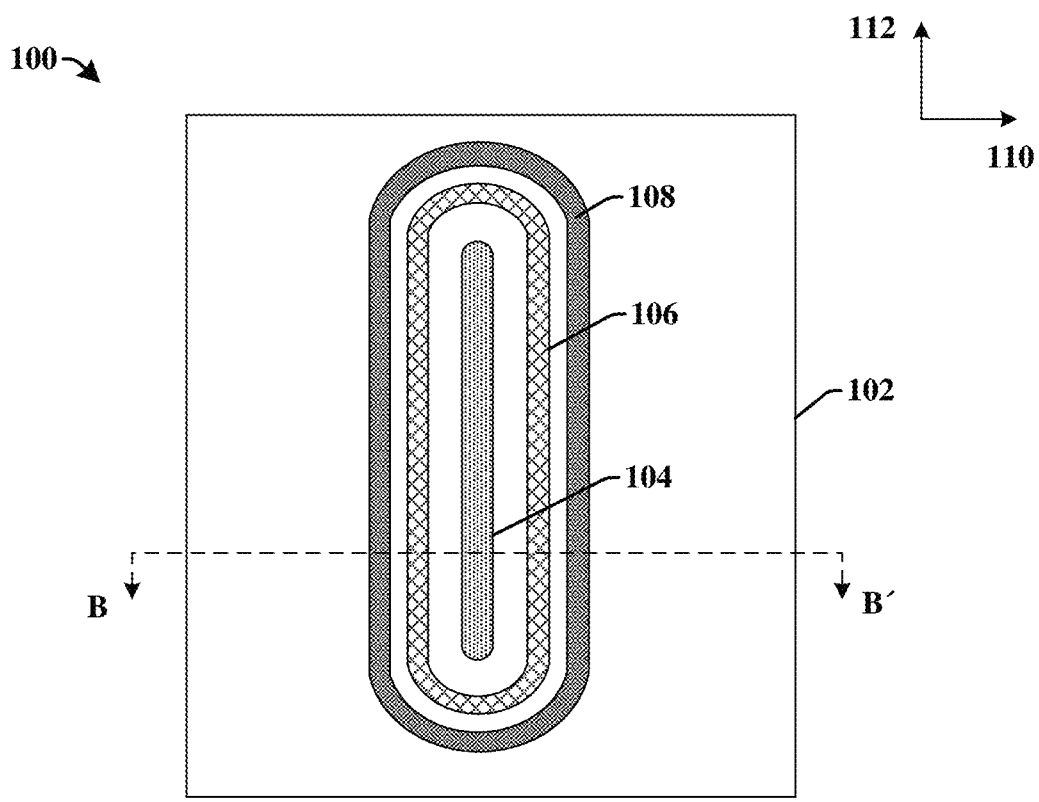
FIGS. 1A-1B illustrate some embodiments of an integrated chip having a transistor device comprising a gate structure that is wrapped around a first source/drain contact to provide isolation between the first source/drain contact and a second source/drain contact.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High-voltage transistor devices are used in many modern day electronic devices. As the size of semiconductor devices continues to shrink, there has been an increased interest in high voltage devices that utilize two-dimensional electron gases (2DEGs). Such high voltage devices are typically formed on stacked substrates comprising a plurality of semiconductor layers. The plurality of semiconductor layers include an active layer and a barrier layer that contacts an upper surface of the active layer to form a heterojunction at their interface. A 2DEG is inherently present at the heterojunction between the active layer and the barrier layer.

Because a 2DEG is inherently present between the active layer and the barrier layer, electrons are able to move freely along the interface.

2DEG based transistor devices may comprise an active area surrounded by an isolation region. The isolation region has a damaged crystalline lattice that confines a 2DEG within the active area by disrupting the 2DEG and mitigating movement of electrons. A source contact and a drain contact are disposed over the active area. To prevent unwanted currents from flowing between the source contact and the drain contact (i.e., to form a device in a "normally off" mode), a gate structure comprising a doped semiconductor material (e.g., p-doped gallium nitride (GaN)) may be disposed within the active area between the source contact and the drain contact. The gate structure is able to interrupt the underlying 2DEG so as to prevent electrons from moving freely under the gate structure.

The gate structure may extend over an entire width of the active area as an elongated or rectangular shaped 'gate finger.' By having the gate structure extending over an entire width of the active area, the movement of electrons between the source contact and the drain contact can be blocked within the active area. However, it has been appreciated that the isolation region does not provide complete isolation, and that there may be unwanted leakage currents that flow around ends of a gate finger and through the isolation region. The unwanted leakage currents can result in a sub-threshold hump in a drain current vs. gate voltage relation of a transistor device. The sub-threshold hump has a number of negative consequences, such as higher power consumption and being difficult to model (e.g., in SPICE curve fitting and/or parameter extraction).

The present disclosure, in some embodiments, relates to an integrated chip that has a transistor device comprising a gate structure that is configured to provide improved isolation between source/drain contacts. The gate structure wraps around a first source/drain contact and a second source/drain contact that wraps around the gate structure. Because the gate structure is able to disrupt an underlying two-dimensional electron gas (2DEG) within the substrate, having the gate structure wrap around the first source/drain contact disrupts the 2DEG along a closed and unbroken path surrounding the first source/drain contact. Disrupting the 2DEG along a closed and unbroken path that surrounds the first source/drain contact improves performance of the transistor device (e.g., reduces a sub-threshold hump in the drain current vs. gate voltage relation of the transistor device) by mitigating leakage between the first source/drain contact and the second source/drain contact.

Figure 1B:
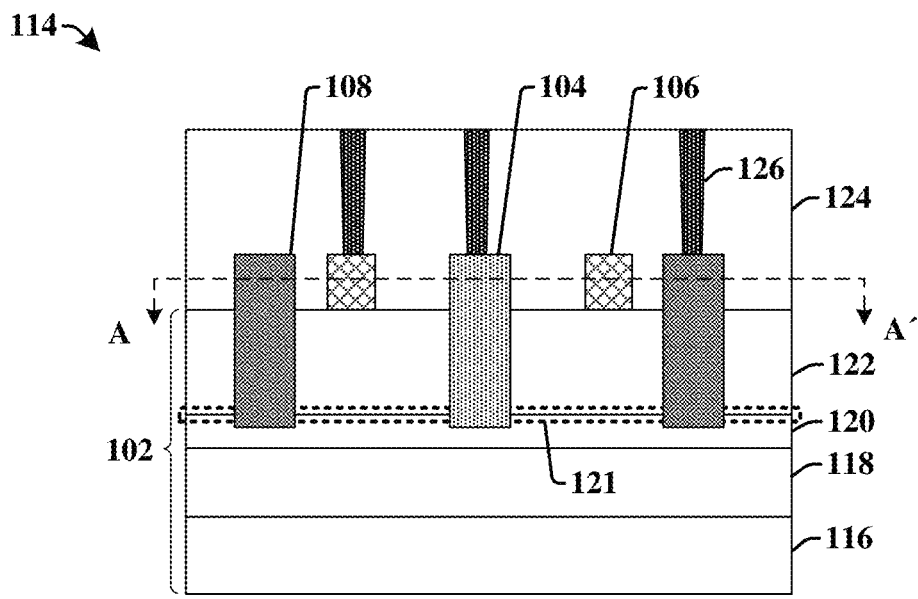

FIGS. 1A-1B illustrate some embodiments of an integrated chip having a transistor device comprising a gate structure that is wrapped around a source/drain contact. FIG. 1A illustrates a top-view 100 of the integrated chip taken along line A-A' of FIG. 1B. FIG. 1B illustrates a cross-sectional view 114 of the integrated chip taken along line B-B' of FIG. 1A.

As shown in top-view 100 of FIG. 1A, the integrated chip comprises a transistor device having a first source/drain contact 104, a gate structure 106, and a second source/drain contact 108 disposed over a stacked substrate 102. The first source/drain contact 104 and the second source/drain contact 108 are separated by the gate structure 106 along a first direction 110 and along a second direction 112 that is perpendicular to the first direction 110. In some embodiments, the first source/drain contact 104 may comprise a source contact and the second source/drain contact 108 may comprise a drain contact. In such embodiments, a source contact is surrounded by the gate structure 106 and the gate structure 106 is surrounded by a drain contact. In other embodiments, the first source/drain contact 104 may comprise a drain contact and the second source/drain contact 108 may comprise a source contact, so that a drain contact is surrounded by the gate structure 106 and the gate structure 106 is surrounded by a source contact.

As shown in cross-sectional view 114 of FIG. 1B, the stacked substrate 102 comprises a plurality of different layers stacked onto one another. In some embodiments, the stacked substrate 102 comprises an active layer 120 (e.g., a channel layer) disposed over a base substrate 116 and a barrier layer 122 disposed over the active layer 120. In some embodiments, a buffer layer 118 may be disposed between the active layer 120 and the base substrate 116 to improve lattice matching between the base substrate 116 and the active layer 120. The active layer 120 and the barrier layer 122 meet at an interface that defines a heterojunction in which a two-dimensional electron gas (2DEG) 121 is present. An inter-level dielectric (ILD) layer 124 is disposed over the stacked substrate 102. A plurality of conductive contacts 126 extend through the ILD layer 124 to contact the first source/drain contact 104, the gate structure 106, and the second source/drain contact 108.

As shown in top-view 100 of FIG. 1A, the gate structure 106 wraps around the first source/drain contact 104 along a first closed loop or a first closed path (e.g., a continuous and unbroken path). The second source/drain contact 108 wraps around the gate structure 106. In some embodiments, the second source/drain contact 108 wraps around the gate structure 106 along a second closed loop or second closed path (e.g., a continuous and unbroken path).

The gate structure 106 is configured to disrupt the 2DEG 121 within the stacked substrate 102. Because the gate structure 106 wraps around the first source/drain contact 104 along the first closed loop, the gate structure 106 is able to disrupt the 2DEG 121 along a continuous path that separates the first source/drain contact 104 and the second source/drain contact 108. By disrupting the 2DEG 121 along a continuous path that separates the first source/drain contact 104 and the second source/drain contact 108, currents are not able to leak around ends of the gate structure 106. Therefore, the gate structure 106 is able to provide for good isolation between the first source/drain contact 104 and the second source/drain contact 108. The isolation provided by the gate structure 106 may mitigate a sub-threshold hump in a drain current vs. gate voltage relation of the transistor device even without an isolation region.

Figure 2A:
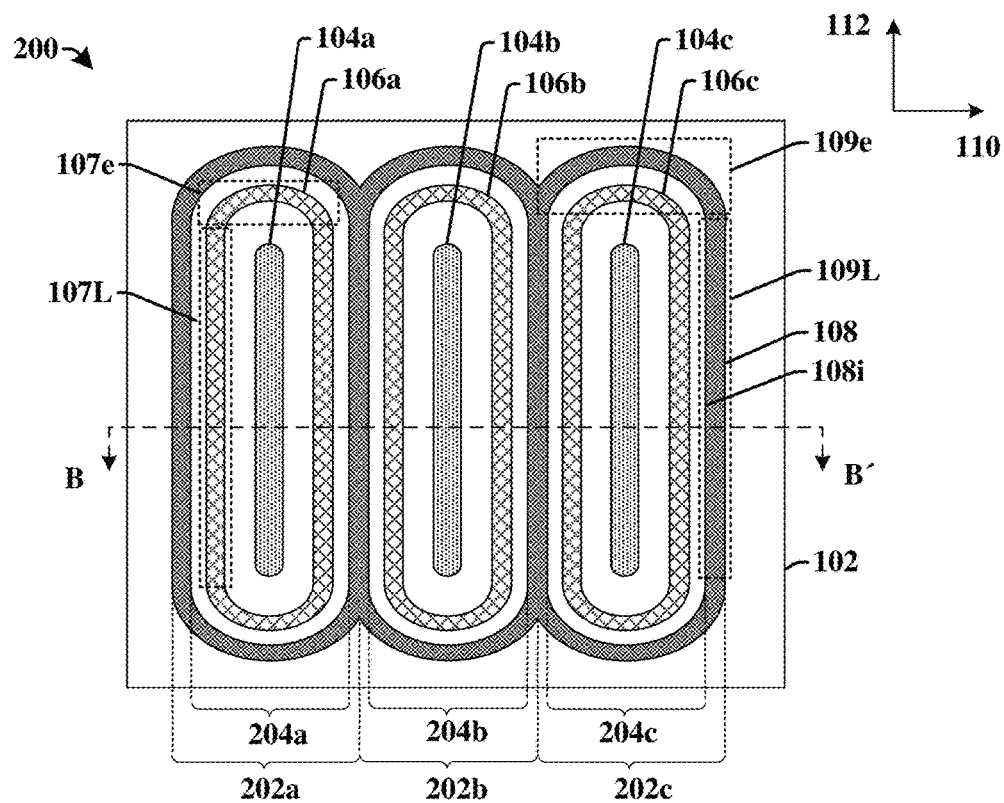
FIGS. 2A-2B illustrate some additional embodiments of an integrated chip having a transistor device comprising gate structures wrapped around first source/drain contacts.
Figure 2B:
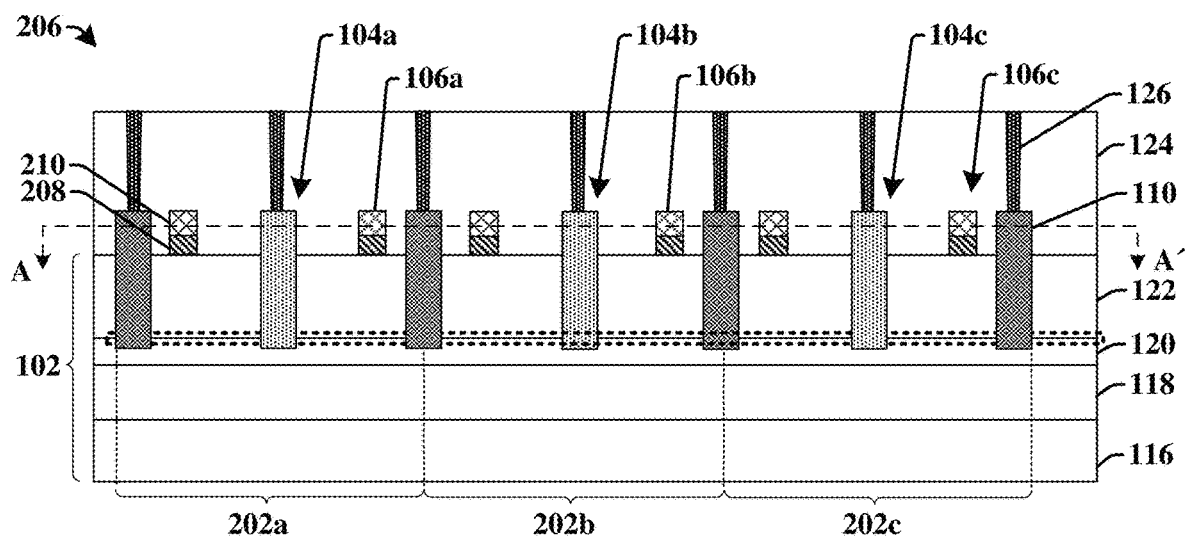

FIGS. 2A-2B illustrate some embodiments of an integrated chip having a transistor device comprising gate structures wrapped around first source/drain contacts. FIG. 2A illustrates a top-view 200 of the integrated chip taken along line A-A' of FIG. 2B. FIG. 2B illustrates a cross-sectional view 206 of the integrated chip taken along line B-B' of FIG. 2A.

As shown in top-view 200 of FIG. 2A, the integrated chip comprises a transistor device having a plurality of first source/drain contacts 104a-104c that are separated from one another along a first direction 110. A plurality of gate structures 106a-106c are disposed over the stacked substrate 102 and are interleaved between the plurality of first source/drain contacts 104a-104c along the first direction 110. The plurality of gate structures 106a-106c are separated from one another along the first direction 110 and are separated from the plurality of first source/drain contacts 104a-104c along the first direction 110 and along a second direction 112 that is perpendicular to the first direction 110. The plurality of gate structures 106a-106c wrap around respective ones of the plurality of first source/drain contacts 104a-104c. For example, a first gate structure 106a wraps around first source/drain contact 104a and a second gate structure 106b wraps around first source/drain contact 104b. Although top-view 200 is illustrated as having three gate structures and three first source/drain contacts it will be appreciated that in various embodiments, a disclosed transistor device may comprise tens, hundreds, or thousands of gate structures and first source/drain contacts.

A second source/drain contact 108 is also disposed over the stacked substrate 102. The second source/drain contact 108 continuously extends in the first direction 110 past outermost ones of the plurality of first source/drain contacts 104a-104c. In some embodiments, the second source/drain contact 108 continuously wraps around the plurality of gate structures 106a-106c and the plurality of first source/drain contacts 104a-104c. The second source/drain contact 108 comprises a plurality of loops 202a-202c that are coupled together. For example, the second source/drain contact 108 may comprise a first loop 202a, a second loop 202b, and a third loop 202c. In some embodiments, the plurality of loops 202a-202c are respectively defined by one or more curved sidewalls of the second source/drain contact 108.

The plurality of loops 202a-202c comprise a plurality of interior sidewalls 108i that define a plurality of openings 204a-204c extending through the second source/drain contact 108. In some embodiments, the plurality of openings 204a-204c are separated from one another along the first direction 110. Respective ones of the plurality of gate structures 106a-106c and the plurality of first source/drain contacts 104a-104c are disposed within respective ones of the plurality of openings 204a-204c. For example, first source/drain contact 104a and first gate structure 106a are disposed within a first opening 204a, first source/drain contact 104b and second gate structure 106b are disposed within a second opening 204b, etc.

In various embodiments, the plurality of first source/drain contacts 104a-104c respectively comprise a rectangular shape, a rounded rectangular shape, a square shape, a rounded square shape, or the like. In various embodiments, the plurality of gate structures 106a-106c and the second source/drain contact 108 may respectively comprise a circular shape, an oval shape, a rounded rectangular shape, a hexagonal shape, a racetrack shape, or the like. In some embodiments, the plurality of gate structures 106a-106c comprise line segments 107L and end segments 107e. The line segments 107L extend in the second direction 112 along opposing sides of the plurality of first source/drain contacts 104a-104c. In some embodiments, the line segments 107L may extend past opposing ends of the plurality of first source/drain contacts 104a-104c. The end segments 107e wrap around ends of the plurality of first source/drain contacts 104a-104c to couple together adjacent ones of the line segments 107L. In various embodiments, the end segments 107e may have a curved sidewall that define a semi-circular shape, a semi-oval shape, a semi-hexagonal shape with rounded corners, or the like. In some embodiments, a rounded shape of the end segments 107e may reduce crowding of electric field lines generated by the plurality of gate structures 106a-106c. In some embodiments, the line segments 107L may define a central region of the plurality of openings 204a-204c having a substantially constant width, while the end segments 107e may define end regions of the openings 204a-204c that have widths that decrease as a distance from the central region increases. In some embodiments, the second source/drain contact 108 may also comprise line segments 109L and end segments 109e.

As shown in cross-sectional view 206 of FIG. 2B, the stacked substrate 102 comprises an active layer 120 disposed over a base substrate 116 and a barrier layer 122 disposed over the active layer 120. In some embodiments, a buffer layer 118 may be disposed between the active layer 120 and the base substrate 116. The active layer 120 and the barrier layer 122 meet at an interface that defines a heterojunction at which a two-dimensional electron gas (2DEG) 121 is present. In various embodiments, the base substrate 116 may comprise silicon, silicon carbide, sapphire, or the like. In some embodiments, the active layer 120 may comprise gallium nitride (GaN), gallium arsenide (GaAs), or the like. In some embodiments, the barrier layer 122 may comprise aluminum gallium nitride (AlGaN), aluminum gallium arsenide (AlGaAs), or the like. In some embodiments, the buffer layer 118 may comprise GaN (having different concentrations of Ga and N than the active layer 120), GaAs (having a different concentrations of Ga and As than the active layer 120), or the like.

In some embodiments, the plurality of gate structures 106a-106c respectively comprise a lower gate layer 208 and a gate contact 210 over the lower gate layer 208. Both the lower gate layer 208 and the gate contact 210 of the plurality of gate structures 106a-106c wrap around the plurality of first source/drain contacts 104a-104c in closed loops. In various embodiments, the gate contact 210 may comprise a metal, such as aluminum, cobalt, titanium, tungsten, or the like. In some embodiments, the transistor device is a high electron mobility transistor (HEMT) device and the lower gate layer 208 is a doped semiconductor material, such as p-doped gallium nitride, for example. The doped semiconductor material allows the plurality of gate structures 106a-106c to interrupt the underlying 2DEG 121 so as to form a "normally-off" device. In other embodiments, the transistor device is a metal-insulator-semiconductor field-effect-transistor (MISFET) device and the lower gate layer 208 is an insulating material, such as silicon dioxide, silicon nitride, or the like.

An ILD layer 124 is disposed over the stacked substrate 102. Conductive contacts 126 extend through the ILD layer 124 to contact the plurality of first source/drain contacts 104a-104c, the plurality of gate structures 106a-106c, and the second source/drain contact 108. In some embodiments (not shown), additional interconnect layers (e.g., interconnect wires and/or interconnect vias) may be disposed within additional ILD layers over the ILD layer 124. The additional interconnect layers may comprise a plurality of conductive interconnects that are configured to electrically couple the plurality of first source/drain contacts 104a-104c and to electrically couple the plurality of gate structures 106a-106c. Because the plurality of first source/drain contacts 104a-104c and the plurality of gate structures 106a-106c are respectively electrically coupled together, the plurality of first source/drain contacts 104a-104c and the plurality of gate structures 106a-106c operate as a single transistor device.

In various embodiments, the conductive contacts 126 may be disposed at different locations on the second source/drain contact 108. For example, in some embodiments the conductive contacts 126 may be disposed on one of the line segments 109L of the second source/drain contact 108, while in other embodiments the conductive contacts 126 may be disposed on one of the end segments 109e of the second source/drain contact 108. In some embodiments, multiple conductive contacts may be disposed on the second source/drain contact 108. In other embodiments, a single conductive contact may be disposed on the second source/drain contact 108.

Figure 3A:
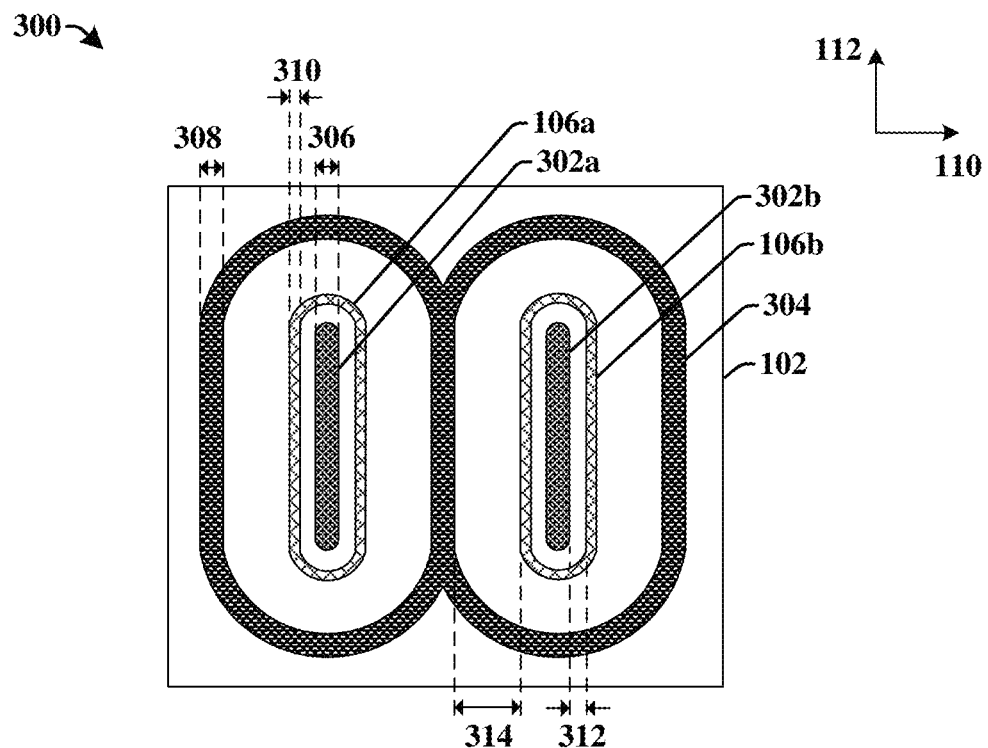
FIG. 3A illustrates a top-view of some embodiments of an integrated chip having a transistor device comprising gate structures wrapped around source contacts.

FIG. 3A illustrates a top-view of some embodiments of an integrated chip having a transistor device comprising gate structures wrapped around source contacts.

The integrated chip 300 comprises a transistor device having a plurality of source contacts 302a-302b separated along a first direction 110. A plurality of gate structures 106a-106b wrap around the plurality of source contacts 302a-302b and a drain contact 304 wraps around the plurality of gate structures 106a-106b. Having the drain contact 304 wrap around the gate structures 106a-106b may improve device performance by allowing a high voltage that is applied to the drain contact 304 to be spread out over a relatively large area.

In some embodiments, the plurality of source contacts 302a-302b have a first width 306 and the drain contact 304 has a second width 308. In some embodiments, the first width 306 and the second width 308 may be larger than a third width 310 of the plurality of gate structures 106a-106b. In some embodiments, the first width 306 and/or the second width 308 may be between approximately 100% and approximately 200% larger than the third width 310, between approximately 50% and approximately 250% larger than the third width 310, or other suitable values. The greater widths of the plurality of source contacts 302a-302b and the drain contact 304 allows for overlying interconnects (e.g., conductive contacts) to form good electrical connections with the plurality of source contacts 302a-302b and the drain contact 304 at large voltages (e.g., greater than approximately 100V, greater than approximately 200V, or the like).

In some embodiments, the plurality of gate structures 106a-106b are separated from the plurality of source contacts 302a-302b by a first distance 312 and from the drain contact 304 by a second distance 314 that is larger than the first distance 312. In some embodiments, the first distance 312 may be in a range of between approximately 1 µm and approximately 15 µm, between approximately 2 µm and approximately 10 µm, or other suitable values. In some embodiments, the second distance 314 may be in a range of between approximately 5 µm and approximately 150 µm, between approximately 10 µm and approximately 100 µm, or other suitable values. By having the second distance 314 larger than the first distance 312, a breakdown voltage of a device can be increased.

Figure 3B:
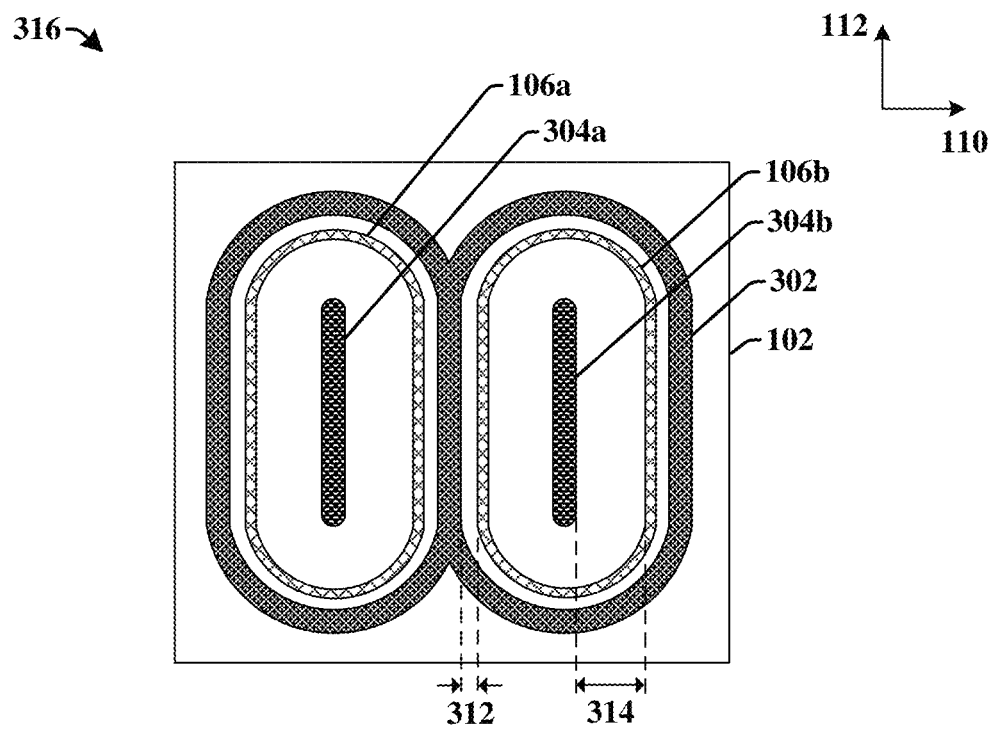
FIG. 3B illustrates a top-view of some embodiments of an integrated chip having a transistor device comprising gate structures wrapped around drain contacts.

Although the integrated chip 300 of FIG. 3A illustrates a transistor device having a plurality of source contacts 302a-302b surrounded by a drain contact 304, it will be appreciated that the isolation provided by the plurality of gate structures 106a-106b allows for positions of the plurality of source contacts 302a-302b and the drain contact 304 to be switched. For example, FIG. 3B illustrates a top-view of some embodiments of an integrated chip 316 having a transistor device comprising a plurality of gate structures 106a-106b wrapped around a plurality of drain contacts 304a-304b and a source contact 302 wrapped around the plurality of gate structures 106a-106b.

Figure 4:
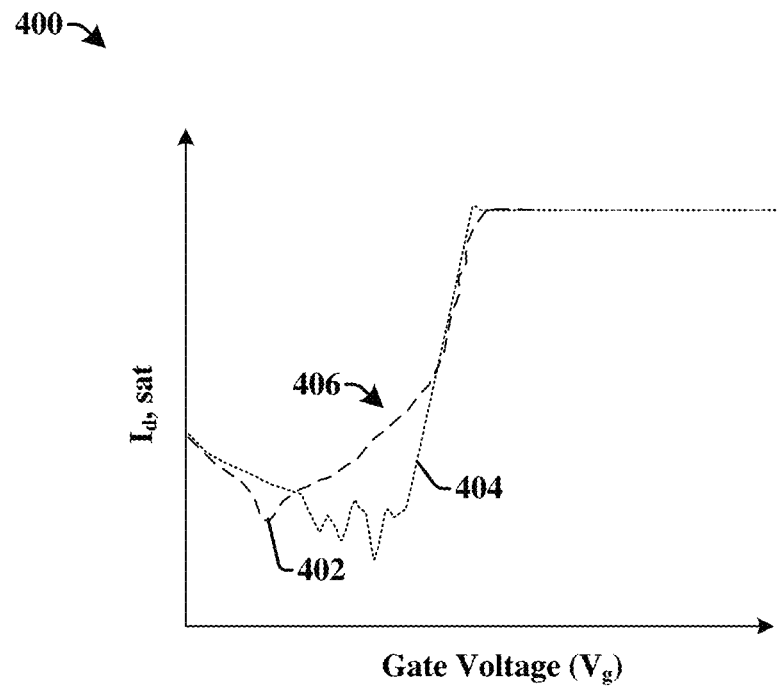
FIG. 4 illustrates a graph showing some embodiments of a drain current as a function of gate voltage for a disclosed transistor device.

FIG. 4 illustrates a graph 400 showing some embodiments of a drain current as a function of a gate voltage for a disclosed transistor device.

Graph 400 illustrates a gate voltage $V_g$ along an x-axis and a drain current ($I_d$) along a y-axis. The drain current of a transistor device having rectangular shaped gate fingers is shown by line 402. The drain current of a transistor device having the disclosed gate structure (e.g., a gate structure that wraps around a first source/drain contact as illustrated, for example, in FIG. 1) is shown by line 404. As shown in graph 400, the drain current shown by line 402 has a larger sub-threshold hump 406 than that of the drain current shown by line 404.

Figure 5:
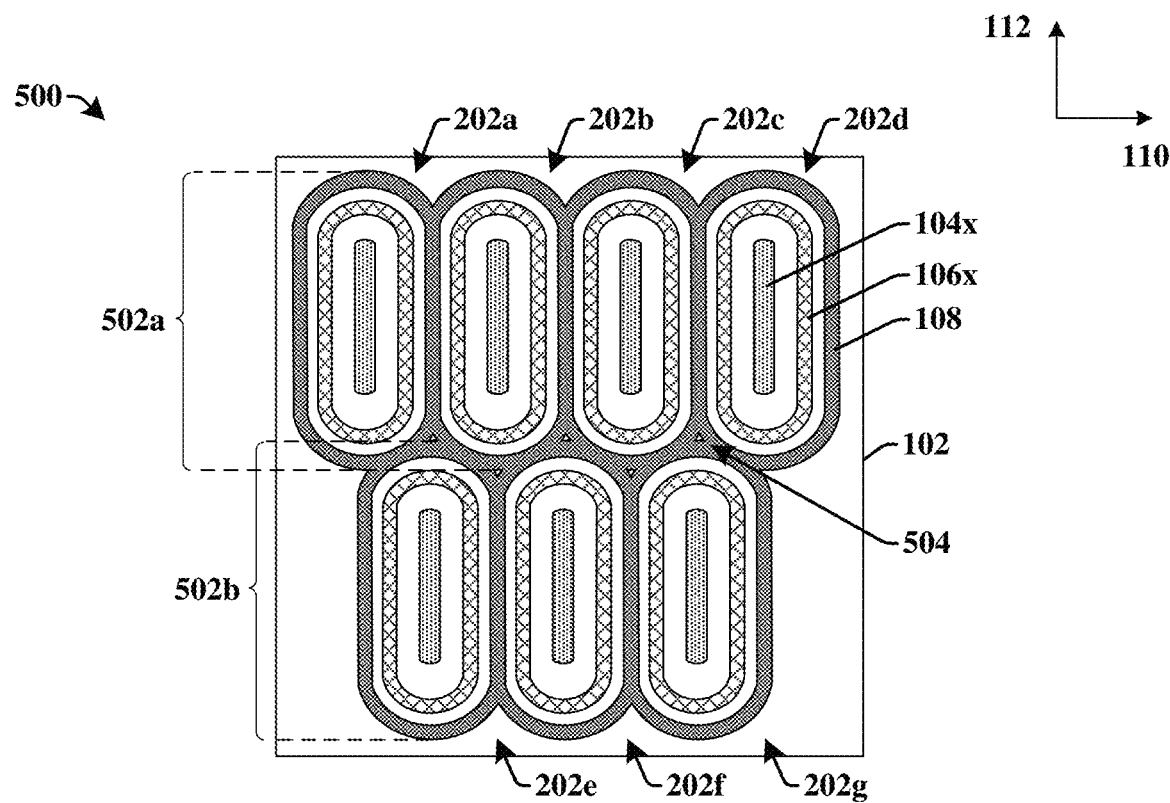
FIG. 5 illustrates a top-view of some embodiments of an integrated chip having a transistor device comprising gate structures wrapped around first source/drain contacts arranged in a two-dimensional array.

FIG. 5 illustrates a top-view of some embodiments of an integrated chip 500 having a transistor device comprising gate structures wrapped around first source/drain contacts arranged in a two-dimensional array.

The integrated chip 500 comprises a transistor device having a plurality of first source/drain contacts 104x, a plurality of gate structures 106x, and a second source/drain contact 108 disposed over a stacked substrate 102. The plurality of first source/drain contacts 104x and the plurality of gate structures 106x are separated along a first direction 110 and along a second direction 112 that is perpendicular to the first direction 110.

The second source/drain contact 108 comprises a plurality of loops 202a-202g that are coupled together as a continuous structure that wraps around the plurality of first source/drain contacts 104x and the plurality of gate structures 106x. In some embodiments, the plurality of loops 202a-202g are arranged in a two-dimensional array extending along the first direction 110 and the second direction 112. For example, the plurality of loops 202a-202g may comprise a first plurality of loops 202a-202d arranged along a first row 502a and a second plurality of loops 202e-202g arranged along a second row 502b that is laterally offset from the first row 502a. In some embodiments, one or more openings 504 may be present between the first plurality of loops 202a-202d and the second plurality of loops 202e-202g. By arranging the plurality of loops 202a-202g in a two dimensional array, a design flexibility of the device can be increased.

Figure 6:
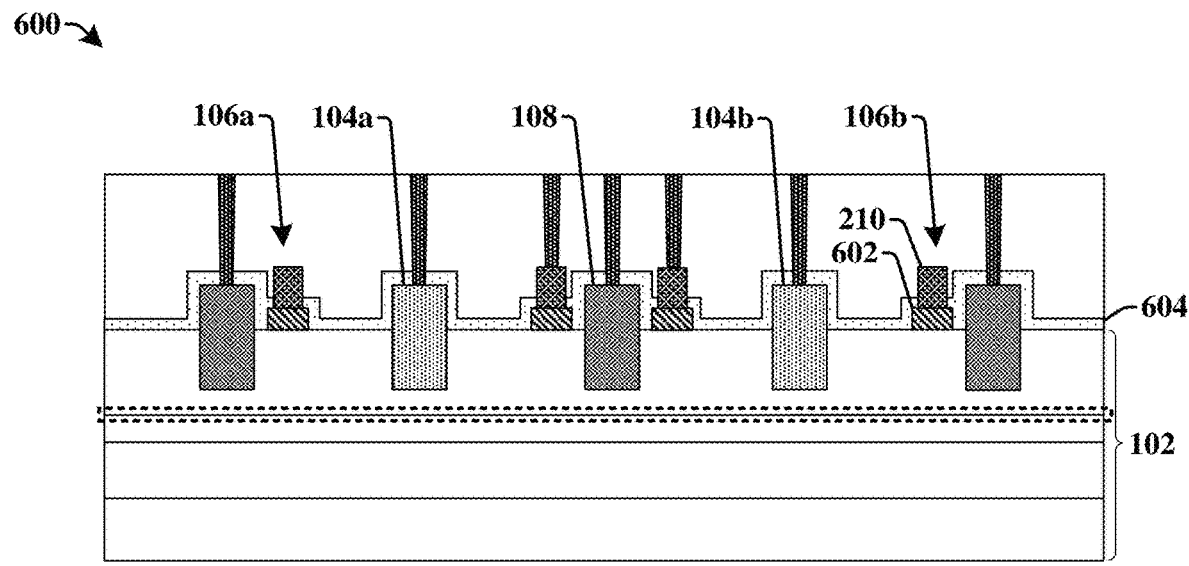
FIG. 6 illustrates a cross-sectional view of some embodiments of a HEMT (high electron mobility transistor) device comprising gate structures wrapped around first source/drain contacts.

It will be appreciated that in various embodiments, the disclosed transistor device may be any transistor device that utilizes a 2DEG. FIGS. 5-6 illustrates some embodiments of integrated chips having different types of transistor devices. FIGS. 5-6 are non-limiting examples of transistor devices that may utilize the disclosed gate structures and one of ordinary skill in the art will appreciate that other types of transistor devices may also be used.

FIG. 6 illustrates some embodiments of an integrated chip 600 having a high electron mobility transistor (HEMT) device comprising gate structures wrapped around first source/drain contacts.

The integrated chip 600 comprises a HEMT device having a plurality of first source/drain contacts 104a-104b, a plurality of gate structures 106a-106b, and a second source/drain contact 108 disposed over a stacked substrate 102. The plurality of gate structures 106a-106b respectively comprise a doped semiconductor material 602 and a gate contact 210 over the doped semiconductor material 602. In some embodiments, the doped semiconductor material 602 may comprise p-doped gallium nitride. In some embodiments, one or more sidewalls of the doped semiconductor material 602 may be laterally offset from one or more sidewalls of the gate contact 210.

A passivation layer 604 extends over the plurality of first source/drain contacts 104a-104b and the second source/drain contact 108. The passivation layer 604 also extends over the doped semiconductor material 602 of the plurality of gate structures 106a-106b. The gate contact 210 extends through the passivation layer 604 to contact the doped semiconductor material 602. In various embodiments, the passivation layer 604 may comprise an oxide (e.g., silicon oxide), a nitride (e.g., silicon nitride), or the like.

Figure 7:
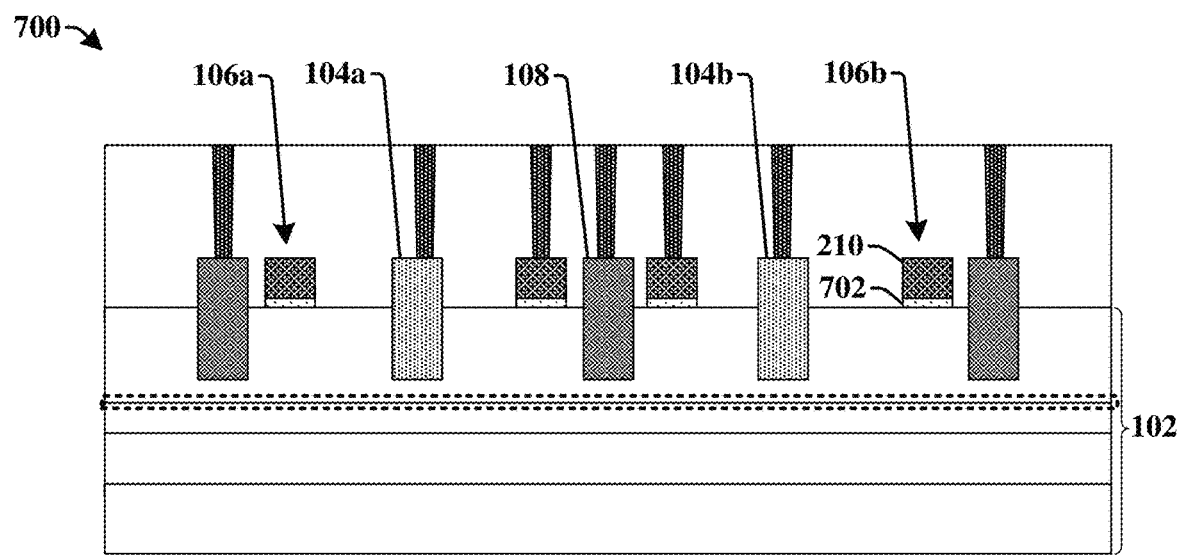
FIG. 7 illustrates a cross-sectional view of some embodiments of a MISFET (metal-insulator-semiconductor field-effect-transistor) device comprising gate structures wrapped around first source/drain contacts.

FIG. 7 illustrates some additional embodiments of an integrated chip 700 having a MISFET (metal-insulator-semiconductor field effect transistor) device comprising gate structures wrapped around first source/drain contacts.

The integrated chip 700 comprises a MISFET device having a plurality of first source/drain contacts 104a-104c, a plurality of gate structures 106a-106c, and a second source/drain contact 108 disposed over a stacked substrate 102. The plurality of gate structures 106a-106c respectively comprise an insulating material 702 and a gate contact 210 over the insulating material 702. In some embodiments, the insulating material 702 may comprise an oxide (e.g., silicon oxide), a nitride (e.g., silicon nitride), or the like. In some embodiments, sidewalls of the insulating material 702 may be substantially aligned with sidewalls of the gate contact 210.

Figure 8A:
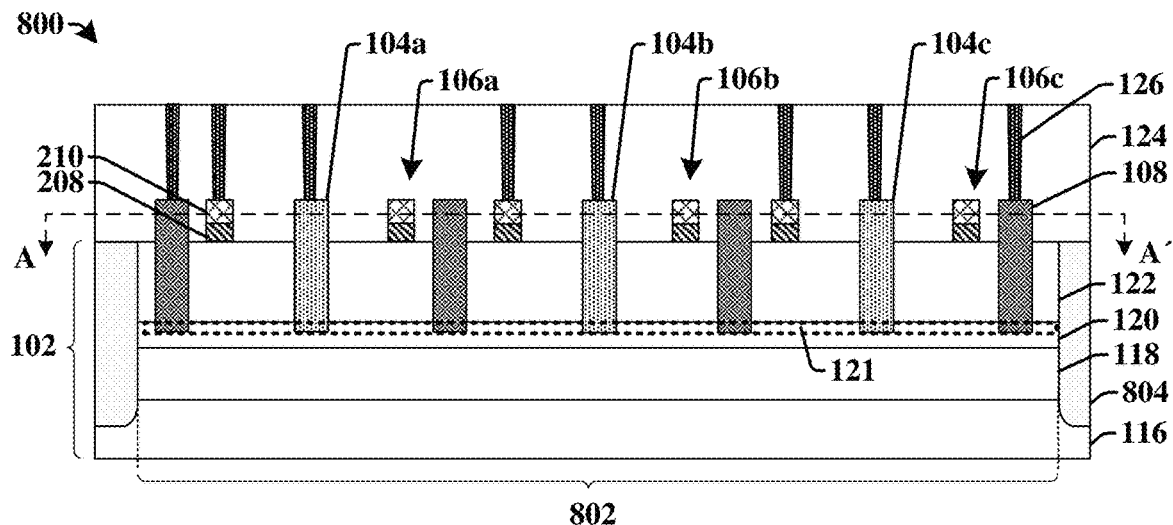
FIGS. 8A-8B illustrate some embodiments of an integrated chip having a transistor device comprising gate structures wrapped around first source/drain contacts and surrounded by an isolation region.
Figure 8B:
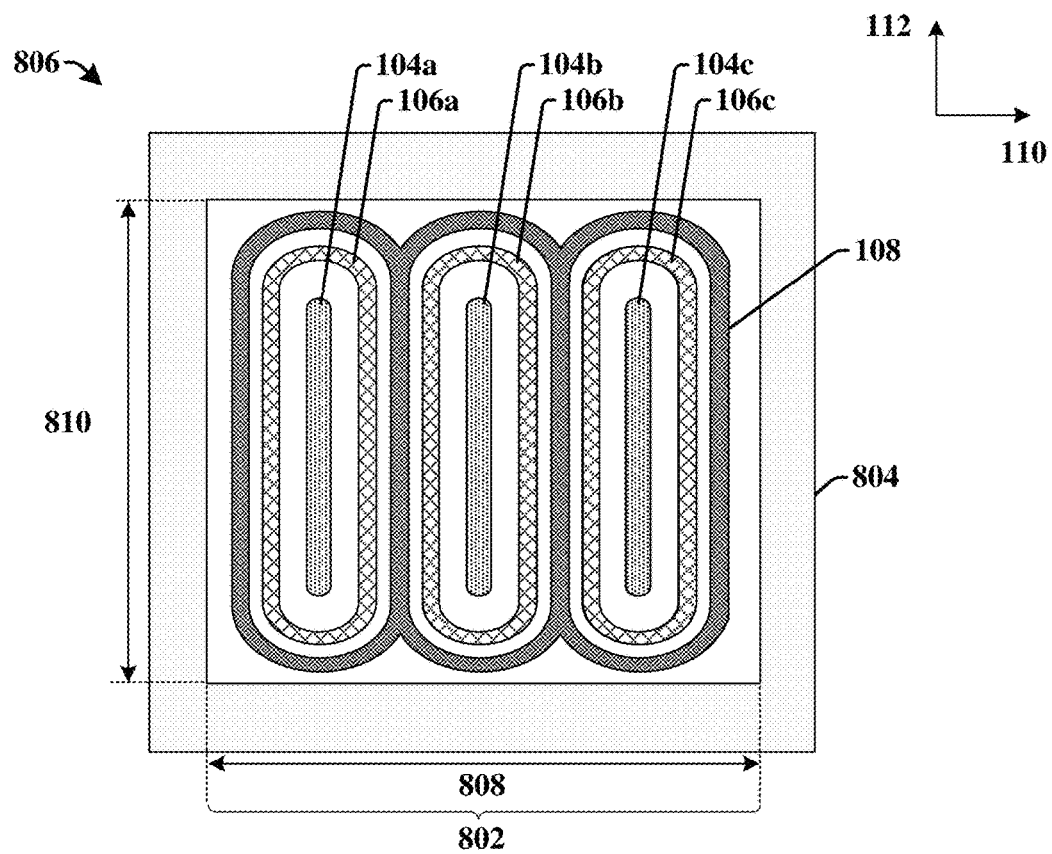

FIGS. 8A-8B illustrate some embodiments of an integrated chip having a transistor device comprising gate structures wrapped around first source/drain contacts and surrounded by an isolation region.

As shown in cross-sectional view 800 of FIG. 8A, the integrated chip comprises an active area 802 disposed within a stacked substrate 102. The stacked substrate 102 comprises an active layer 120 disposed over a base substrate 116 and a barrier layer 122 disposed over the active layer 120. In some embodiments, a buffer layer 118 may be disposed between the active layer 120 and the base substrate 116. A 2DEG 121 is present at an interface of the active layer 120 and the barrier layer 122.

The active area 802 is surrounded by an isolation region 804. In some embodiments, the isolation region 804 may comprise a region of the stacked substrate 102 in which crystalline structures of one or more layers of the stacked substrate 102 are damaged (e.g., by way of an ion implantation process). The crystalline damage within the one or more layers disrupts the 2DEG 121, so as to prevent the 2DEG 121 from extending into the isolation region 804.

As shown in top-view 806 of FIG. 8B, the active area 802 is surrounded by the isolation region 804 along a first direction 110 and along a second direction 112 that is perpendicular to the first direction 110. The active area 802 has a length 808 extending along the first direction 110 and a width 810 extending along the second direction 112. In some embodiments, the length 808 is larger than the width 810.

A plurality of first source/drain contacts 104a-104c, a plurality of gate structures 106a-106c, and a second source/drain contact 108 are disposed over the active area 802. The second source/drain contact 108 continuously wraps around the plurality of gate structures 106a-106c and the plurality of first source/drain contacts 104a-104c. In some embodiments, the active area 802 extends past outermost sidewalls of the second source/drain contact 108 along the first direction 110 and/or along the second direction 112. In other embodiments (not shown), a part of the plurality of first source/drain contacts 104a-104c may extend to over the isolation region 804. For example, the plurality of first source/drain contacts 104a-104c may extend along the second direction 112 over the isolation region 804.

Figure 9:
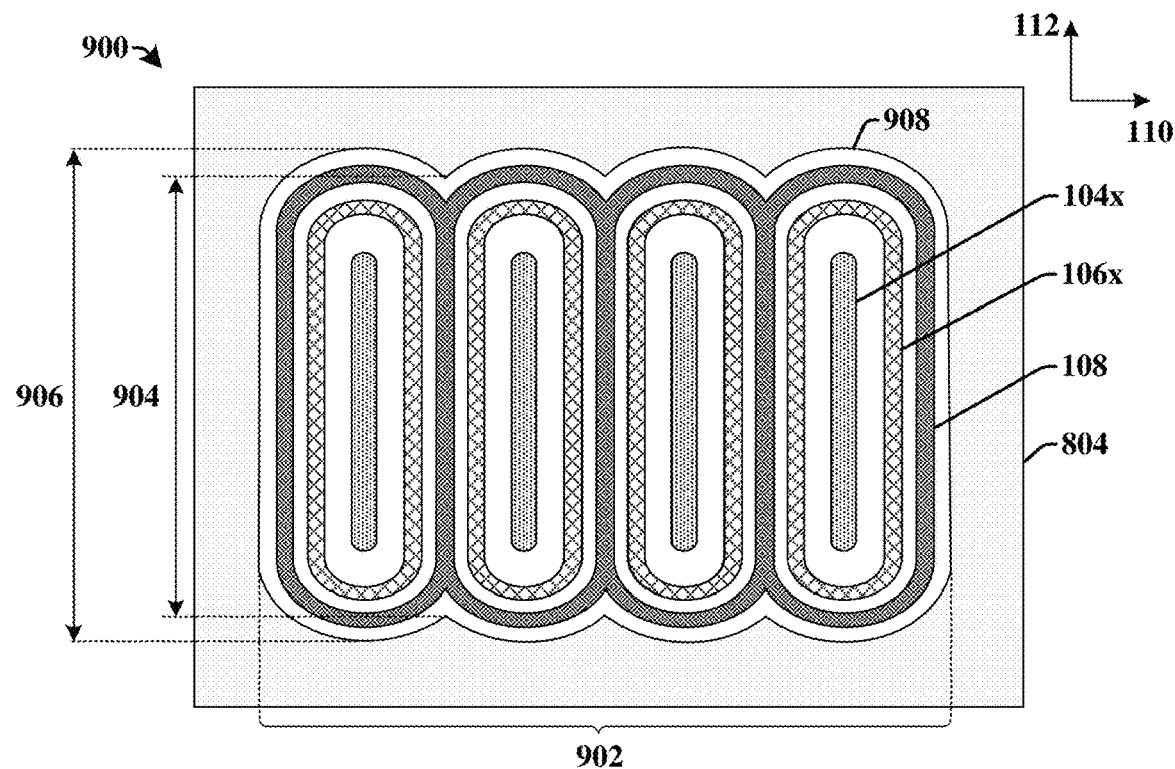
FIG. 9 illustrates some additional embodiments of an integrated chip having a transistor device comprising gate structures wrapped around first source/drain contacts and surrounded by an isolation region.

FIG. 9 illustrates a top-view of an integrated chip 900 having a transistor device comprising gate structures wrapped around first source/drain contacts and surrounded by an isolation region.

The integrated chip 900 comprises an active area 902 surrounded by an isolation region 804 along a first direction 110 and along a second direction 112. A plurality of gate structures 106x are disposed over the active area 902 around a plurality of first source/drain contacts 104x. The active area 902 has a first width 904 and a second width 906 that is larger than the first width 904. In some embodiments, the active area 902 comprises a plurality of curved edges 908 that extend between the first width 904 and the second width 906. In some embodiments, the plurality of curved edges 908 are substantially conformal to curved outer sidewalls of the second source/drain contact 108. The curved edges 908 allow the isolation region 804 to provide for greater isolation over a smaller area.

Figure 10A:
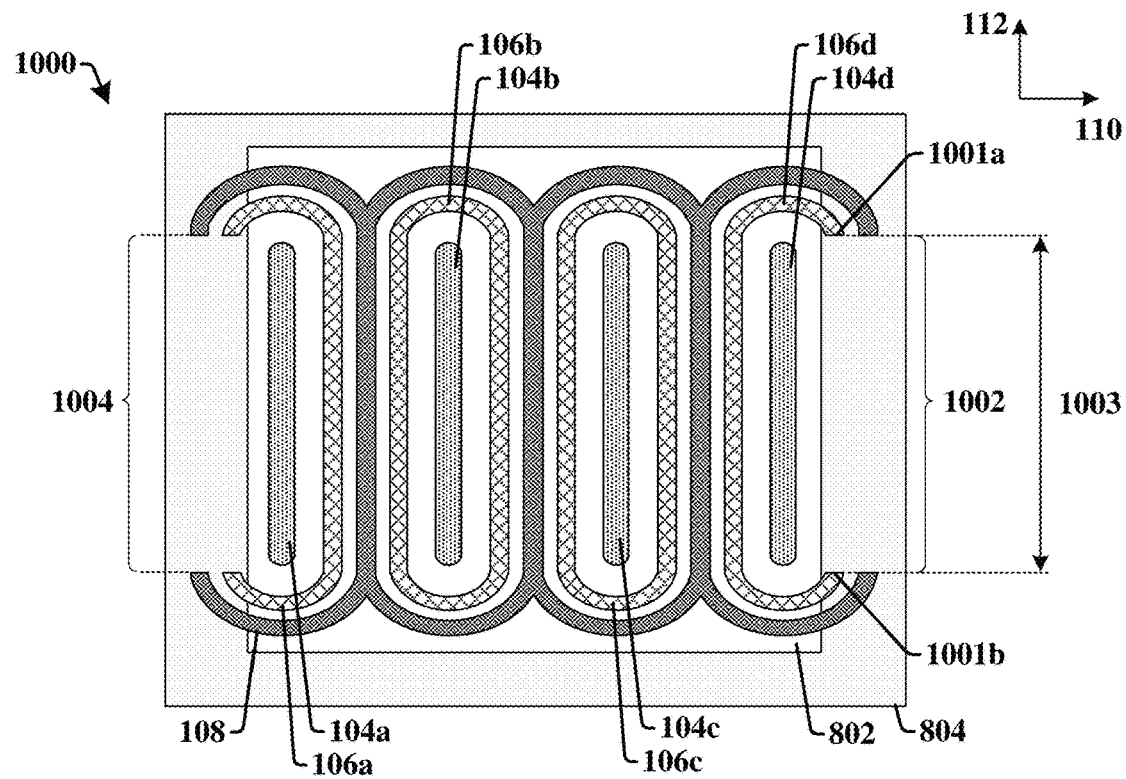
FIGS. 10A-10C illustrate top-views of some alternative embodiments of integrated chips having transistor devices comprising gate structures and/or a second source/drain contact with different shapes.

FIG. 10A illustrates a top-view of some alternative embodiments of an integrated chip 1000 having a transistor device comprising gate structures and/or a second source/drain contact with different shapes.

The integrated chip 1000 comprises a transistor device having a plurality of gate structures 106a-106d disposed within an active area 802 of a substrate 102 and separated along a first direction 110. The plurality of gate structures 106a-106d respectively surround one of a plurality of first source/drain contacts 104a-104d and are separated from one another by a second source/drain contact 108.

The plurality of gate structures 106a-106d comprise a first gate structure 106a disposed along a first end of the active area 802 and a last gate structure 106d disposed along a second end of the active area 802 opposing the first end. The first gate structure 106a and the last gate structure 106d are outermost gate structures (i.e., are at opposing ends of a series of gate structures over the active area 802). The first gate structure 106a is separated from the last gate structure 106d by way of a plurality of central gate structures 106b-106c. In some embodiments, the first gate structure 106a and the last gate structure 106d may have different shapes than the plurality of central gate structures 106b-106c.

For example, in some embodiments the first gate structure 106a may wrap around first source/drain contact 104a along a continuous path that extends between a first end 1001a disposed along a first side of first source/drain contact 104a and a second end 1001b disposed along the first side of first source/drain contact 104a. The first end 1001a is separated from the second end 1001b by a non-zero distance 1003 (e.g., so that the first gate structure 106a is in the shape of a "C"). In some embodiments, the first gate structure 106a and/or the last gate structure 106d may have ends comprising sidewalls that define a first opening 1002 along an outer edge of the first gate structure 106a and/or the last gate structure 106d, which faces away from the active area 802. Because there is a first opening 1002 along an outer edge of the first gate structure 106a and/or the last gate structure 106d, the first gate structure 106a and/or the last gate structure 106d extend part way, but not completely, around a first source/drain contact 104a and/or a last source/drain contact 104d, respectively. In contrast, the central gate structures 106b-106c extend completely around first source/drain contacts, 104b and 104c, in closed and continuous loops.

In some embodiments, the second source/drain contact 108 may also have sidewalls that define a second opening 1004 along an outer edge of the second source/drain contact 108, which faces away from the active area 802. Because there is a second opening 1004 along an outer edge of the second source/drain contact 108, the second source/drain contact 108 extends part way, but not completely, around the first source/drain contact 104a and/or the last source/drain contact 104d. In contrast, the second source/drain contact 108 extends completely around first source/drain contacts, 104*b* and 104*c*, in closed and continuous loops.

Figure 10B:
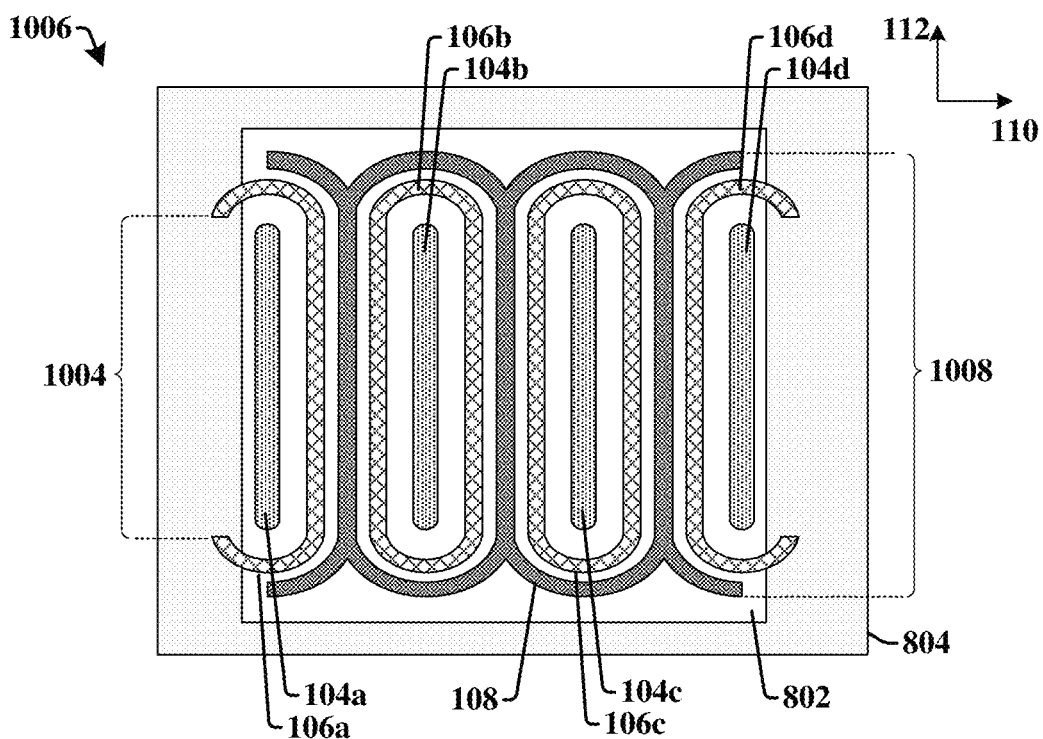
Figure 10C:
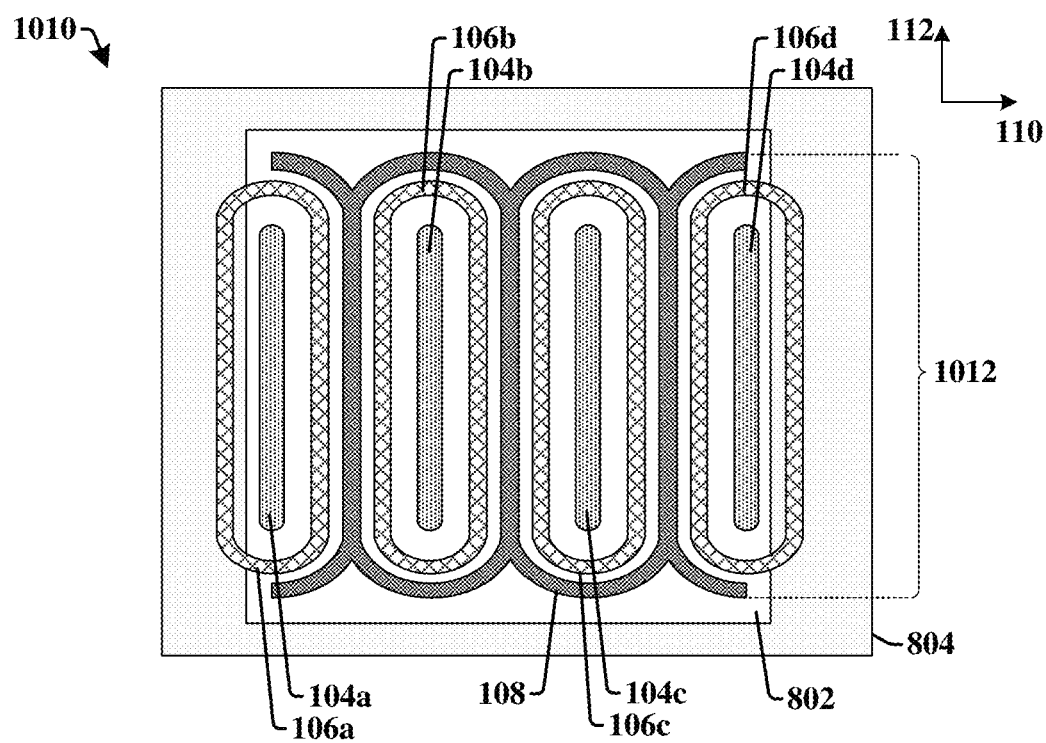

In some embodiments, the first opening 1002 and the second opening 1004 may have substantially equal sizes. In other embodiments, the plurality of gate structures 106*a*-106*d* and the second source/drain contact 108 may define openings that have different sizes. By having openings with different sizes, a size of the transistor device can be changed and a leakage of the transistor device can be varied. For example, as shown in top-view 1006 of FIG. 10B, the first gate structure 106*a* and the last gate structure 106*d* may have a first opening 1002 that is smaller than a second opening 1008 within the second source/drain contact 108. By having the second opening 1008 larger than the first opening 1002, leakage between the plurality of first source/drain contacts 104*a*-104*d* and the second source/drain contact 108 can be further reduced. In yet other embodiments, shown in top-view 1010 of FIG. 10C, the second source/drain contact 108 may have an opening 1012 along outer edges, while the first gate structure 106*a* and the last gate structure 106*d* extend in closed loops (i.e., so that the first gate structure and the last gate structure do not have an opening).

Figure 11A:
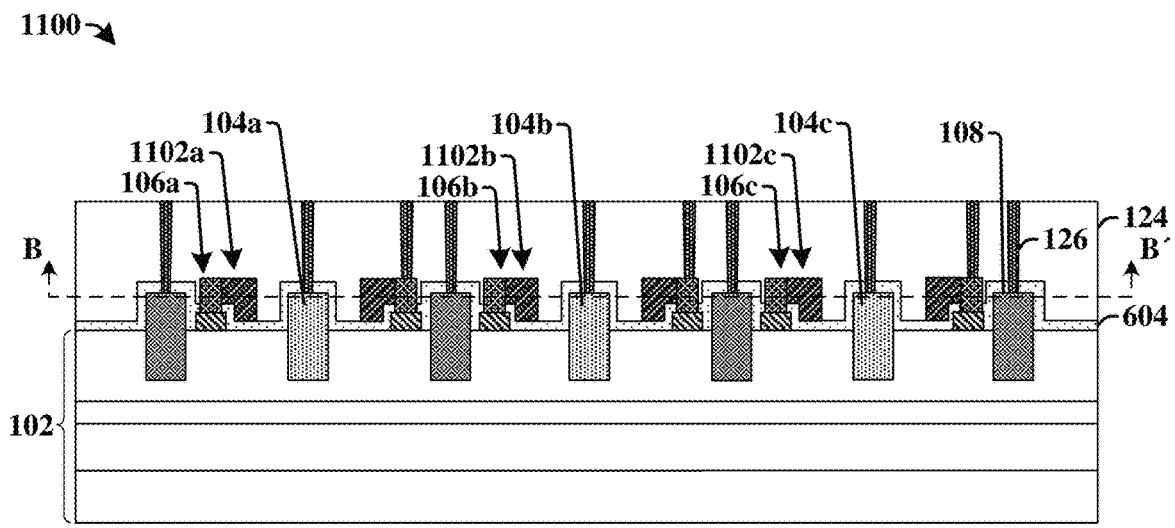
FIGS. 11A-11B illustrate some embodiments of an integrated chip having a transistor device comprising field plates wrapped around first source/drain contacts.
Figure 11B:
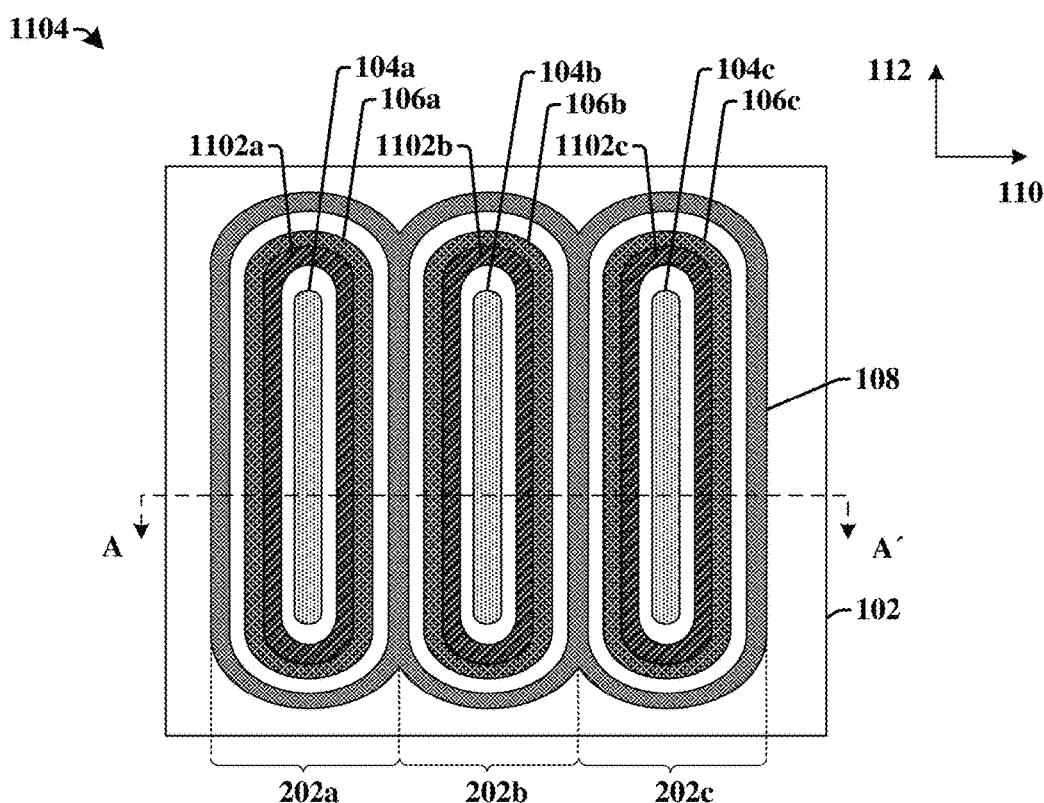

FIGS. 11A-11B illustrate some embodiments of integrated chips having a transistor device comprising field plates wrapped around source/drain contacts. FIG. 11A illustrates a cross-sectional view 1100 of the integrated chip taken along line A-A' of FIG. 11B. FIG. 11B illustrates a top-view 1104 of the integrated chip taken along line B-B' of FIG. 11A. For ease of illustration, the passivation layer 604 has been omitted from top-view 1104.

As shown in cross-sectional view 1100 of FIG. 11A, the integrated chip comprises a transistor device having a plurality of first source/drain contacts 104*a*-104*c* and a plurality of gate structures 106*a*-106*c* disposed over a stacked substrate 102. The plurality of gate structures 106*a*-106*c* are interleaved between the plurality of first source/drain contacts 104*a*-104*c* along the first direction 110. A second source/drain contact 108 is disposed over the stacked substrate 102 and continuously wraps around the plurality of gate structures 106*a*-106*c* and the plurality of first source/drain contacts 104*a*-104*c*.

A plurality of field plates 1102*a*-1102*c* are disposed over the stacked substrate 102 between the plurality of first source/drain contacts 104*a*-104*c* and the second source/drain contact 108. In some embodiments, the plurality of field plates 1102*a*-1102*c* may be located between the plurality of first source/drain contacts 104*a*-104*c* and the plurality of gate structures 106*a*-106*c*. In some such embodiments, the plurality of first source/drain contacts 104*a*-104*c* may comprise a plurality of drain contacts and the second source/drain contact 108 may comprise a source contact, so that the plurality of field plates 1102*a*-1102*c* are between the plurality of gate structures 106*a*-106*c* and the plurality of drain contacts. In other embodiments, the plurality of field plates 1102*a*-1102*c* may be located between the plurality of gate structures 106*a*-106*c* and the second source/drain contact 108. In some such embodiments, the plurality of first source/drain contacts 104*a*-104*c* may comprise a plurality of source contacts and the second source/drain contact 108 may comprise a drain contact, so that the plurality of field plates 1102*a*-1102*c* are between the plurality of gate structures 106*a*-106*c* and the drain contact.

In some embodiments, the plurality of field plates 1102*a*-1102*c* may be electrically coupled to the plurality of gate structures 106*a*-106*c*. In other embodiments (not shown), the plurality of field plates 1102*a*-1102*c* may be electrically coupled to the plurality of first source/drain contacts 104*a*-104*c* or the second source/drain contact 108. In some embodiments, the plurality of field plates 1102*a*-1102*c* may be disposed laterally adjacent to the plurality of gate structures 106*a*-106*c* and/or the plurality of first source/drain contacts 104*a*-104*c*. In other embodiments, the plurality of field plates 1102*a*-1102*c* may be located higher in a back-end of the line (BEOL) stack. For example, the plurality of field plates 1102*a*-1102*c* may be located on an interconnect layer that is over ILD layer 124.

As shown in top-view 1104 of FIG. 11B, the plurality of field plates 1102*a*-1102*c* wrap around the plurality of first source/drain contacts 104*a*-104*c* so as to extend past opposing sides of the first source/drain contacts 104*a*-104*c* along the first direction 110 and along the second direction 112. In some embodiments, the plurality of field plates 1102*a*-1102*c* wrap around the plurality of first source/drain contacts 104*a*-104*c* in closed loops.

FIGS. 12A-21 illustrate some embodiments of a method of forming an integrated chip having a high electron mobility (HEMT) device comprising gate structures wrapped around first source/drain contacts. Although FIGS. 12A-21 are described in relation to a method, it will be appreciated that the structures disclosed in FIGS. 12A-21 are not limited to such a method, but instead may stand alone as structures independent of the method.

Figure 12B:
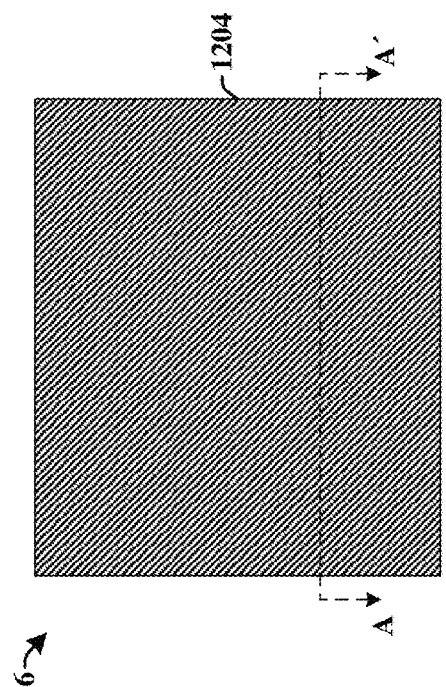
Figure 12A:
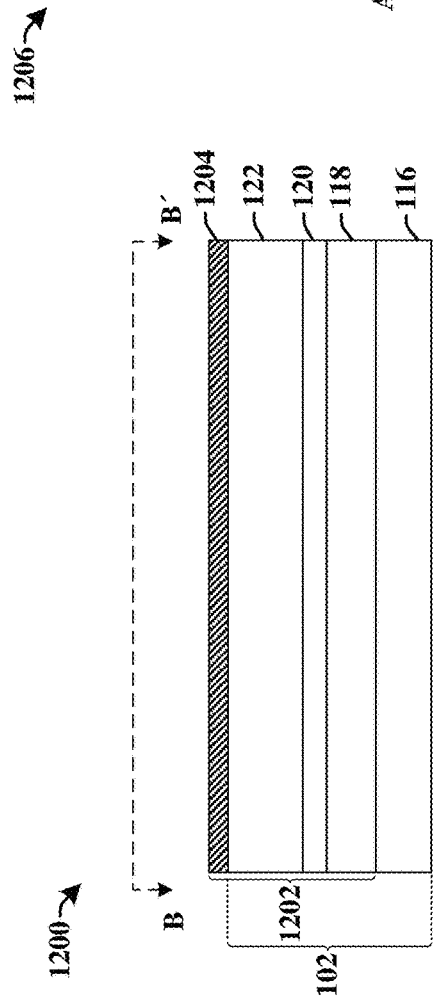

As shown in cross-sectional view 1200 of FIG. 12A and top-view 1206 of FIG. 12B, an epitaxial stack 1202 is formed over a base substrate 116 to define a stacked substrate 102. In some embodiments, the epitaxial stack 1202 may comprise an active layer 120 formed over the base substrate 116, a barrier layer 122 formed on the active layer 120, and a doped semiconductor layer 1204 formed on the barrier layer 122. In some embodiments, the epitaxial stack 1202 may further comprise a buffer layer 118 formed onto the base substrate 116 prior to the formation of the active layer 120.

In various embodiments, the base substrate 116 may comprise silicon, silicon carbide, sapphire, or the like. In some embodiments, the active layer 120 may comprise gallium nitride (GaN), gallium arsenide (GaAs), or the like. In some embodiments, the barrier layer 122 may comprise aluminum gallium nitride (AlGaN), aluminum gallium arsenide (AlGaAs), or the like. In some embodiments, the buffer layer 118 may comprise GaN (having different concentrations of Ga and N than the active layer 120), GaAs (having a different concentrations of Ga and As than the active layer 120), or the like. In some embodiments, the buffer layer 118, the active layer 120, the barrier layer 122, and the doped semiconductor layer 1204 may be epitaxially grown onto the base substrate 116 by way of chemical vapor deposition processes, physical vapor deposition processes, and/or the like.

Figure 13B:
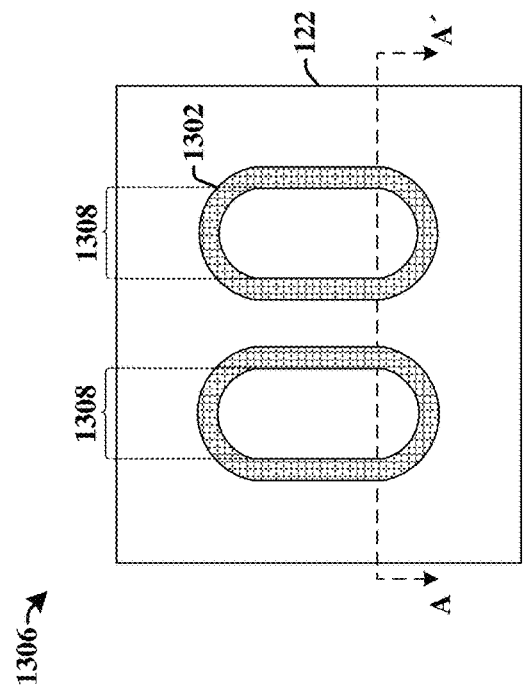
Figure 13A:
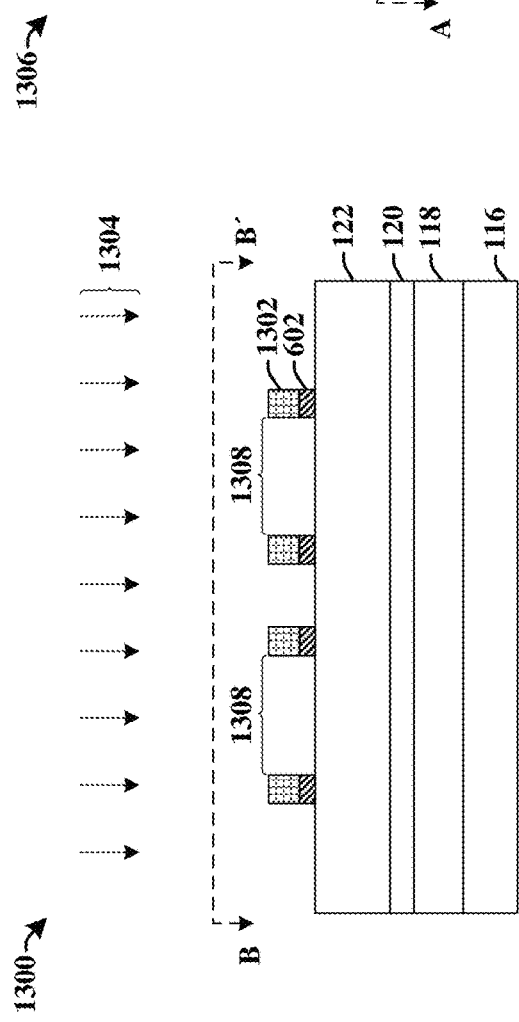

As shown in cross-sectional view 1300 of FIG. 13A and top-view 1306 of FIG. 13B, the doped semiconductor layer (1204 of FIGS. 12A-12B) may be selectively patterned according to a first masking layer 1302. Patterning the doped semiconductor layer results in a doped semiconductor material 602 having a plurality of interior sidewalls that define a plurality of cavities 1308 that extends through the doped semiconductor material 602. In some embodiments, the plurality of interior sidewalls extend along closed and unbroken paths that surrounds the plurality of cavities 1308. In some embodiments, the doped semiconductor layer may be selectively patterned by exposing the doped semiconductor layer to a first etchant 1304 according to the first masking layer 1302. In some embodiments, the first masking layer 1302 may comprise a photosensitive material (e.g., photoresist). In various embodiments, the first etchant 1304 may comprise a wet etchant or a dry etchant.

Figure 14A:
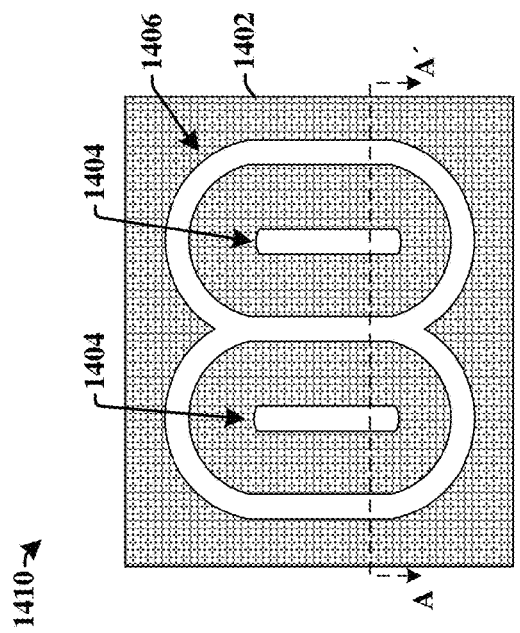
Figure 14B:
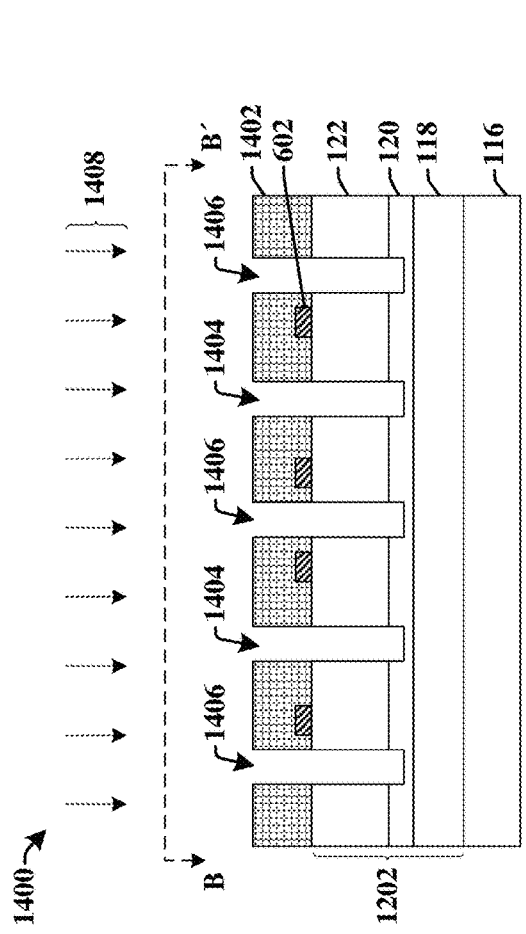

As shown in cross-sectional view 1400 of FIG. 14A and top-view 1410 of FIG. 14B, the epitaxial stack 1202 may be selectively patterned according to a second masking layer 1402 to form a plurality of first source/drain recesses 1404 and a second source/drain recess 1406. In some embodiments, the plurality of first source/drain recesses 1404 and the second source/drain recess 1406 may extend through the barrier layer 122 and into the active layer 120. In some embodiments, the epitaxial stack 1202 may be selectively patterned by exposing the epitaxial stack 1202 to a second etchant 1408 according to the second masking layer 1402. In some embodiments, the second masking layer 1402 may comprise a photosensitive material (e.g., photoresist). In various embodiments, the second etchant 1408 may comprise a wet etchant or a dry etchant.

Figure 15A:
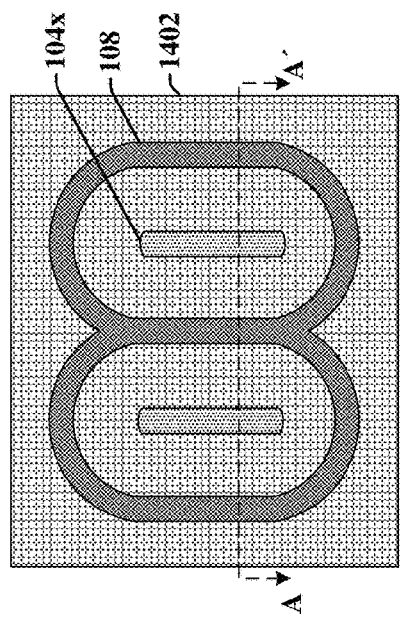
Figure 15B:
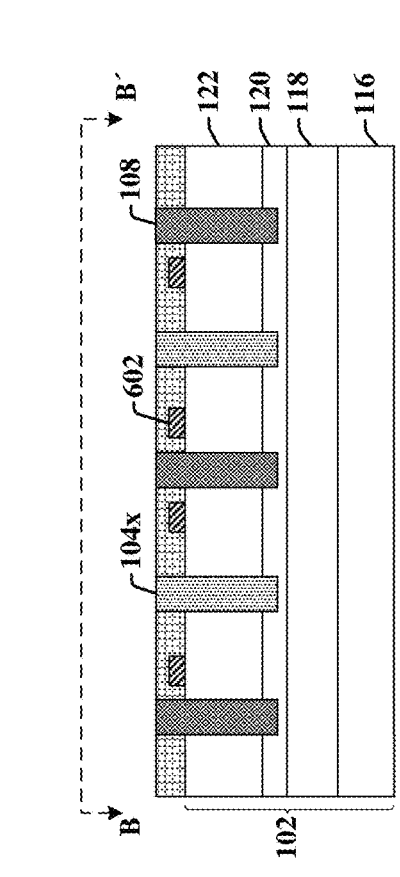

As shown in cross-sectional view 1500 of FIG. 15A and top-view 1502 of FIG. 15B, a conductive material is formed within the plurality of first source/drain recesses 1404 to define a plurality of first source/drain contacts 104x over the stacked substrate 102. The conductive material is also formed within the second source/drain recess 1406 to define a second source/drain contact 108 over the stacked substrate 102. The second source/drain contact 108 wraps around the plurality of first source/drain contacts 104x as a continuous structure. In various embodiments, the conductive material may comprise a metal, such as aluminum, tungsten, titanium, cobalt, or the like. In some embodiments, the conductive material may be formed by a deposition process (e.g., CVD, PVD, sputtering, PE-CVD, or the like) and/or a plating process (e.g., an electroplating process, an electro-less plating process, or the like). In some embodiments, a planarization process (e.g., a chemical mechanical planarization process) may be performed after forming the conductive material.

In some alternative embodiments (not shown), the plurality of first source/drain contacts 104x and the second source/drain contact 108 may be formed over a topmost surface of the barrier layer 122 without forming the plurality of first source/drain recesses and the second source/drain recess. In such embodiments, the plurality of first source/drain contacts 104x and the second source/drain contact 108 have bottommost surfaces that are over the barrier layer 122.

As shown in cross-sectional view 1600 of FIG. 16A and top-view 1602 of FIG. 16B, a passivation layer 604 is formed over the plurality of first source/drain contacts 104x, the second source/drain contact 108, and the stacked substrate 102. In various embodiments, the passivation layer 604 may comprise an oxide (e.g., silicon dioxide), a nitride (e.g., silicon nitride), a carbide (e.g., silicon carbide), or the like. In some embodiments, the passivation layer 604 may be formed by a deposition process (e.g., CVD, PVD, sputtering, PE-CVD, or the like).

As shown in cross-sectional view 1700 of FIG. 17A and top-view 1706 of FIG. 17B, in some embodiments, an active area 802 is defined within the stacked substrate 102 after depositing the passivation layer 604. The active area 802 is defined to contain the plurality of first source/drain contacts 104x and the second source/drain contact 108. In some embodiments, the active area 802 may be defined by selectively implanting ions 1702 into the stacked substrate 102 according to a third masking layer 1704. The implanted ions damage the layers of the stacked substrate 102 to define an isolation region 804 that surrounds and defines the active area 802. The damage to the layers prevents a 2DEG from extending into the isolation region 804. In some embodiments, the third masking layer 1704 may comprise a photosensitive material (e.g., photoresist).

As shown in cross-sectional view 1800 of FIG. 18A and top-view 1808 of FIG. 18B, the passivation layer 604 is selectively patterned to define openings 1802 extending through the passivation layer 604 and exposing the doped semiconductor material 602. In some embodiments, the passivation layer 604 may be selectively patterned by exposing the passivation layer 604 to a third etchant 1806 according to a fourth masking layer 1804. In some embodiments, the fourth masking layer 1804 may comprise a photosensitive material (e.g., photoresist). In various embodiments, the third etchant 1806 may comprise a wet etchant or a dry etchant.

As shown in cross-sectional view 1900 of FIG. 19A and top-view 1904 of FIG. 19B, a gate contact material 1902 is formed in the openings 1802 in the passivation layer 604 and over the fourth masking layer 1804. In some embodiments, the gate contact material 1902 may comprise a metal such as aluminum, tungsten, cobalt, titanium, or the like. In some embodiments, the gate contact material 1902 may be formed by a deposition process (e.g., CVD, PVD, sputtering, PE-CVD, or the like) and/or a plating process (e.g., an electro-plating process, an electro-less plating process, or the like). In some embodiments, a planarization process (e.g., a chemical mechanical planarization process) may be performed after forming the gate contact material 1902.

As shown in cross-sectional view 2000 of FIG. 20A and top-view 2002 of FIG. 20B, the gate contact material (1902 of FIGS. 19A-19B) is patterned to define a gate contact 210. The gate contact 210 and the doped semiconductor material 602 collectively define a plurality of gate structures 106x that wrap around the plurality of first source/drain contacts 104x. The second source/drain contact 108 wraps around the plurality of gate structures 106x.

As shown in cross-sectional view 2100 of FIG. 21, plurality of conductive contacts 126 are formed within an inter-level dielectric (ILD) layer 124 over the stacked substrate 102. In some embodiments, the plurality of conductive contacts 126 may be formed by way of a damascene process. In such embodiments, an ILD layer 124 is formed over the stacked substrate 102. The ILD layer 124 is etched to form contacts holes, which are subsequently filled with a conductive material (e.g., tungsten, copper, and/or aluminum). A chemical mechanical planarization (CMP) process is subsequently performed to remove excess of the conductive material from over the ILD layer 124.

Figure 22:
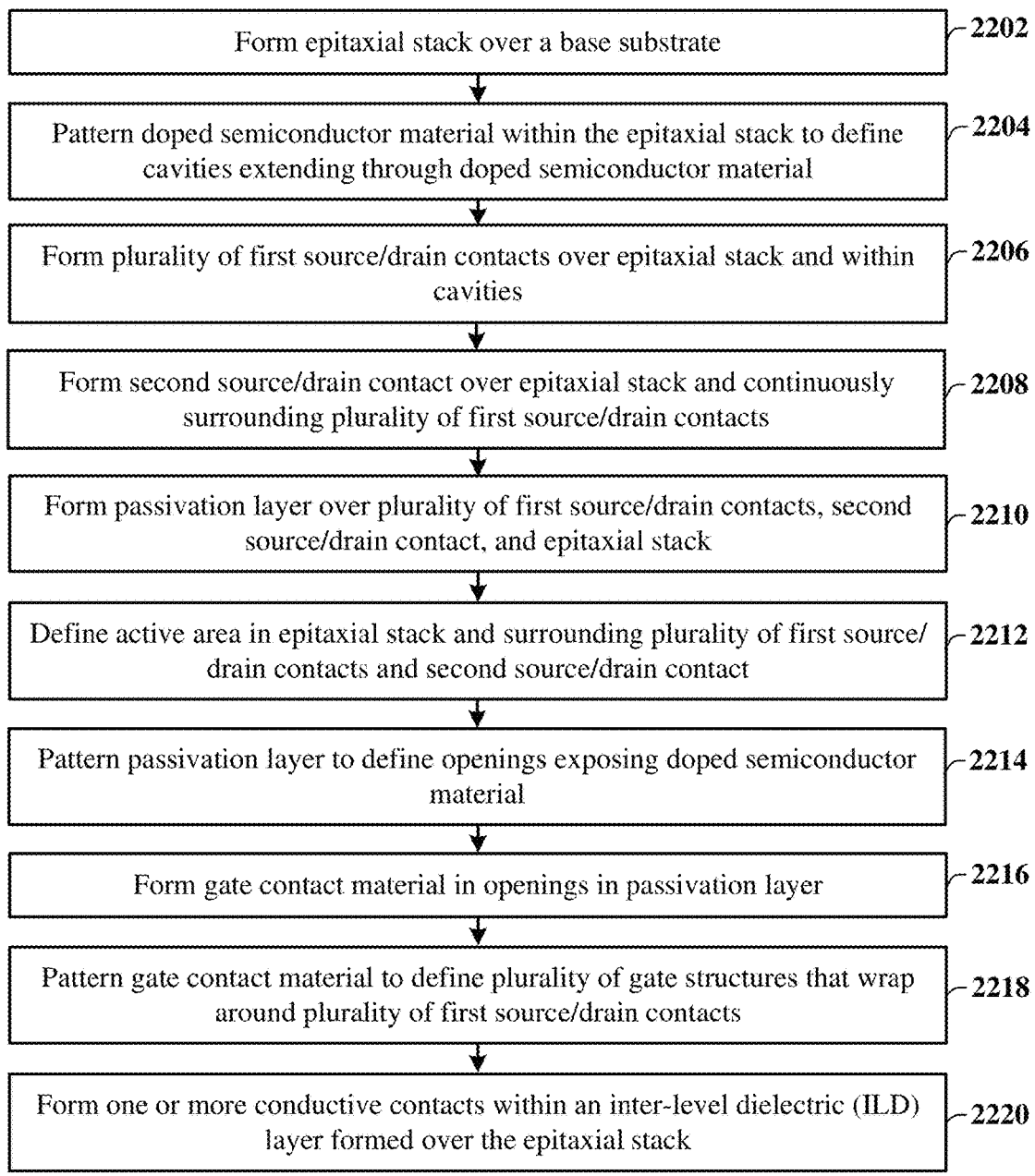
FIG. 22 illustrates a flow diagram of some embodiments of a method of forming an integrated chip having a HEMT device comprising gate structures wrapped around first source/drain contacts.

FIG. 22 illustrates a flow diagram of some embodiments of a method 2200 of forming an integrated chip having a HEMT device comprising gate structures wrapped around first source/drain contacts.

While the disclosed methods (e.g., methods 2200 and 3000) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 2202, an epitaxial stack is formed over a base substrate. The epitaxial stack comprises an active layer over the base substrate, a barrier layer over the active layer, and a doped semiconductor layer over the barrier layer. FIGS.

12A-12B illustrate a cross-sectional view 1200 and a top-view 1206 of some embodiments corresponding to act 2202.

At act 2204, the doped semiconductor layer within the epitaxial stack is patterned to define cavities extending through a doped semiconductor material. FIGS. 13A-13B illustrate a cross-sectional view 1300 and a top-view 1306 of some embodiments corresponding to act 2204.

At act 2206, a plurality of first source/drain contacts are formed over the epitaxial stack and within the cavities. FIGS. 14A-15B illustrate cross-sectional views, 1400 and 1500, and top-views, 1410 and 1502, of some embodiments corresponding to act 2206.

At act 2208, a second source/drain contact is formed over the epitaxial stack and continuously surrounding the plurality of first source/drain contacts. FIGS. 14A-15B illustrate cross-sectional views, 1400 and 1500, and top-views, 1410 and 1502, of some embodiments corresponding to act 2208.

At act 2210, a passivation layer is formed over the plurality of first source/drain contacts, the second source/drain contact, and the epitaxial stack. FIGS. 16A-16B illustrate a cross-sectional view 1600 and a top-view 1602 of some embodiments corresponding to act 2210.

At act 2212, an active area is defined in the epitaxial stack, in some embodiments. The active area surrounds the plurality of first source/drain contacts, the second source/drain contact, and the doped semiconductor material. FIGS. 17A-17B illustrate a cross-sectional view 1700 and a top-view 1706 of some embodiments corresponding to act 2212.

At act 2214, the passivation layer is patterned to define openings exposing the doped semiconductor material. FIGS. 18A-18B illustrate a cross-sectional view 1800 and a top-view 1808 of some embodiments corresponding to act 2214.

At act 2216, a gate contact material is formed in the openings in the passivation layer. FIGS. 19A-19B illustrate a cross-sectional view 1900 and a top-view 1904 of some embodiments corresponding to act 2216.

At act 2218, the gate contact material is patterned to define a plurality of gate structures that wrap around the plurality of first source/drain contacts. FIGS. 20A-20B illustrate a cross-sectional view 2000 and a top-view 2002 of some embodiments corresponding to act 2218.

At act 2220, one or more conductive contacts are formed within an inter-level dielectric (ILD) layer formed over the epitaxial stack. FIG. 21 illustrates a cross-sectional view 2100 of some embodiments corresponding to act 2220.

FIGS. 23A-29 illustrate some embodiments of a method of forming an integrated chip having a MISFET (metal-insulator-semiconductor field effect transistor) device comprising gate structures wrapped around first source/drain contacts. Although FIGS. 23A-29 are described in relation to a method, it will be appreciated that the structures disclosed in FIGS. 23A-29 are not limited to such a method, but instead may stand alone as structures independent of the method.

As shown in cross-sectional view 2300 of FIG. 23A and top-view 2302 of FIG. 23B, an epitaxial stack 1202 is formed over a base substrate 116 to define a stacked substrate 102. In some embodiments, the epitaxial stack 1202 may comprise an active layer 120 formed over the base substrate 116 and a barrier layer 122 formed on the active layer 120. In some embodiments, the epitaxial stack 1202 may also comprise a buffer layer 118 formed onto the base substrate 116 prior to the formation of the active layer 120.

As shown in cross-sectional view 2400 of FIG. 24A and top-view 2406 of FIG. 24B, the epitaxial stack 1202 may be selectively patterned according to a first masking layer 2402 to form a plurality of first source/drain recesses 1404 and a second source/drain recess 1406. In some embodiments, the plurality of first source/drain recesses 1404 and the second source/drain recess 1406 may extend through the barrier layer 122 and into the active layer 120. In some embodiments, the epitaxial stack 1202 may be selectively patterned by exposing the epitaxial stack 1202 to a first etchant 2404 according to the first masking layer 2402. In some embodiments, the first masking layer 2402 may comprise a photosensitive material (e.g., photoresist). In various embodiments, the first etchant 2404 may comprise a wet etchant or a dry etchant.

As shown in cross-sectional view 2500 of FIG. 25A and top-view 2502 of FIG. 25B, a conductive material is formed within the plurality of first source/drain recesses 1404 and the second source/drain recess 1406 to define a plurality of first source/drain contacts 104x and a second source/drain contact 108. In various embodiments, the conductive material may comprise a metal, such as aluminum, tungsten, titanium, cobalt, or the like. In some alternative embodiments (not shown), the plurality of first source/drain contacts 104x and the second source/drain contact 108 may be formed over the barrier layer 122 without forming the one or more source contact recesses and the drain contact recess.

As shown in cross-sectional view 2600 of FIG. 26A and top-view 2604 of FIG. 26B, an active area 802 is defined within the stacked substrate 102, in some embodiments. In some embodiments, the active area 802 may be defined by selectively implanting ions 1702 into the stacked substrate 102 according to a second masking layer 2602. The implanted ions damage the layers of the stacked substrate 102 to define an isolation region 804 that surrounds and defines the active area 802. The damage to the layers prevents a 2DEG from extending into the isolation region 804. In some embodiments, the second masking layer 2602 may comprise a photosensitive material (e.g., photoresist).

Figure 27B:
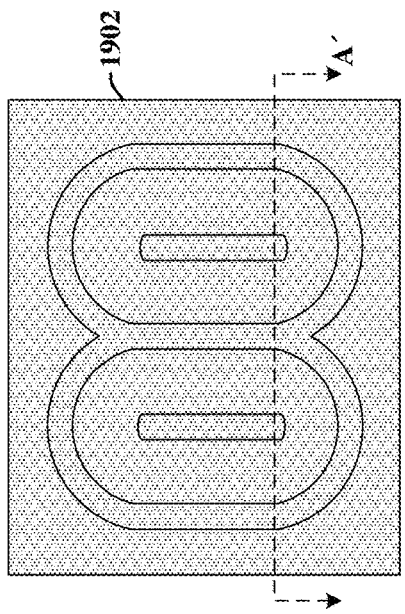
Figure 27A:
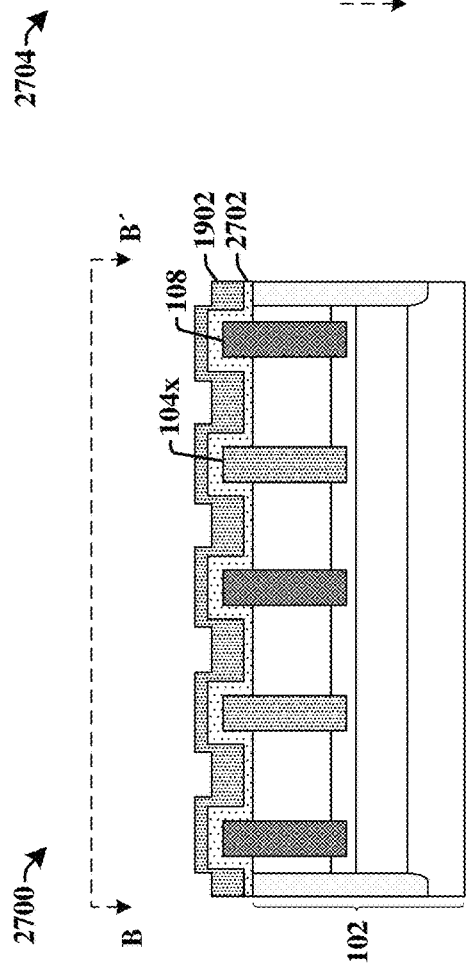

As shown in cross-sectional view 2700 of FIG. 27A and top-view 2704 of FIG. 27B, a gate dielectric layer 2702 and a gate contact material 1902 are formed over the stacked substrate 102. In various embodiments, the gate dielectric layer 2702 may comprise an oxide (e.g., silicon dioxide), a nitride (e.g., silicon nitride), or the like. In various embodiments, the gate contact material 1902 may comprise doped polysilicon, a metal (e.g., aluminum, titanium, cobalt, tungsten, or the like), or the like. In some embodiments, the gate dielectric layer 2702 may be formed by deposition processes (e.g., CVD, PVD, sputtering, PE-CVD, or the like). In some embodiments, the gate contact material 1902 may be formed by deposition processes (e.g., CVD, PVD, sputtering, PE-CVD, or the like) and/or a plating process (e.g., an electro-plating process, an electro-less plating process, or the like).

Figure 28B:
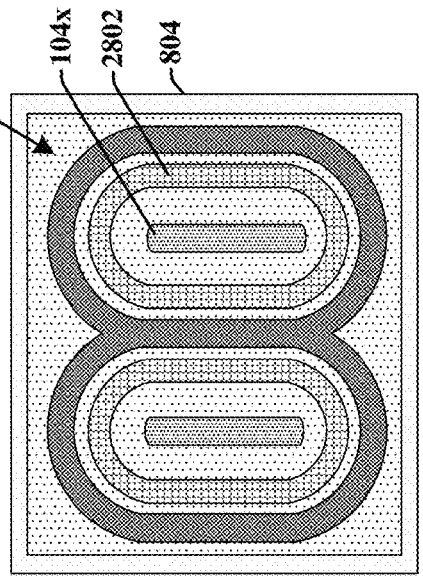
Figure 28A:
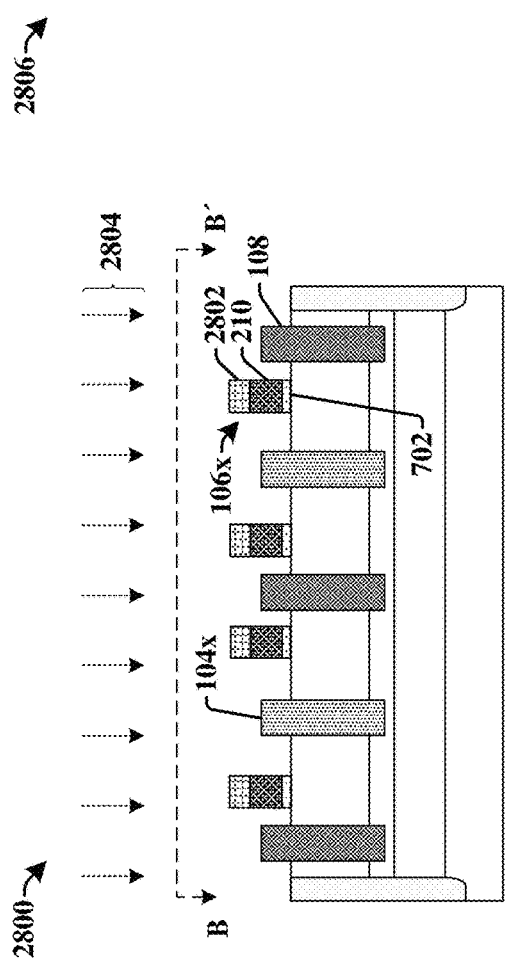

As shown in cross-sectional view 2800 of FIG. 28A and top-view 2806 of FIG. 28B, the gate dielectric layer (2702 of FIG. 27A) and the gate contact material (1902 of FIG. 27A) are selectively patterned to define a plurality of gate structures 106x that wrap around the plurality of first source/drain contacts 104x. The plurality of gate structures 106x respectively comprise an insulating material 702 and a gate contact 210 over the insulating material 702. In some embodiments, the gate dielectric layer (2702 of FIG. 27A) and the gate contact material (1902 of FIG. 27A) may be selectively patterned by exposing the gate dielectric layer and the gate contact material to a second etchant 2804 according to a third masking layer 2802. In some embodiments, the third masking layer 2802 may comprise a photosensitive material (e.g., photoresist). In various embodiments, the second etchant 2804 may comprise a wet etchant or a dry etchant.

Figure 29:
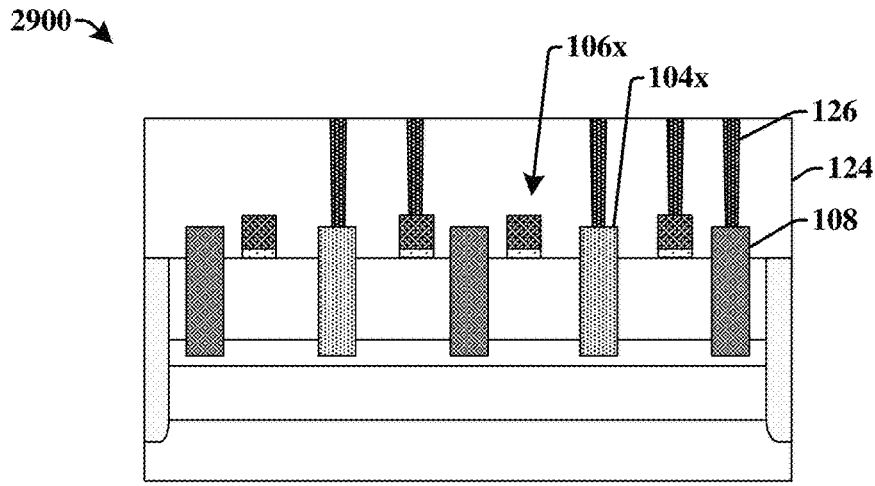

As shown in cross-sectional view 2900 of FIG. 29, a plurality of conductive contacts 126 are formed within an inter-level dielectric (ILD) layer 124 formed over the stacked substrate 102. In some embodiments, the plurality of conductive contacts 126 may respectively be formed by way of a damascene process.

Figure 30:
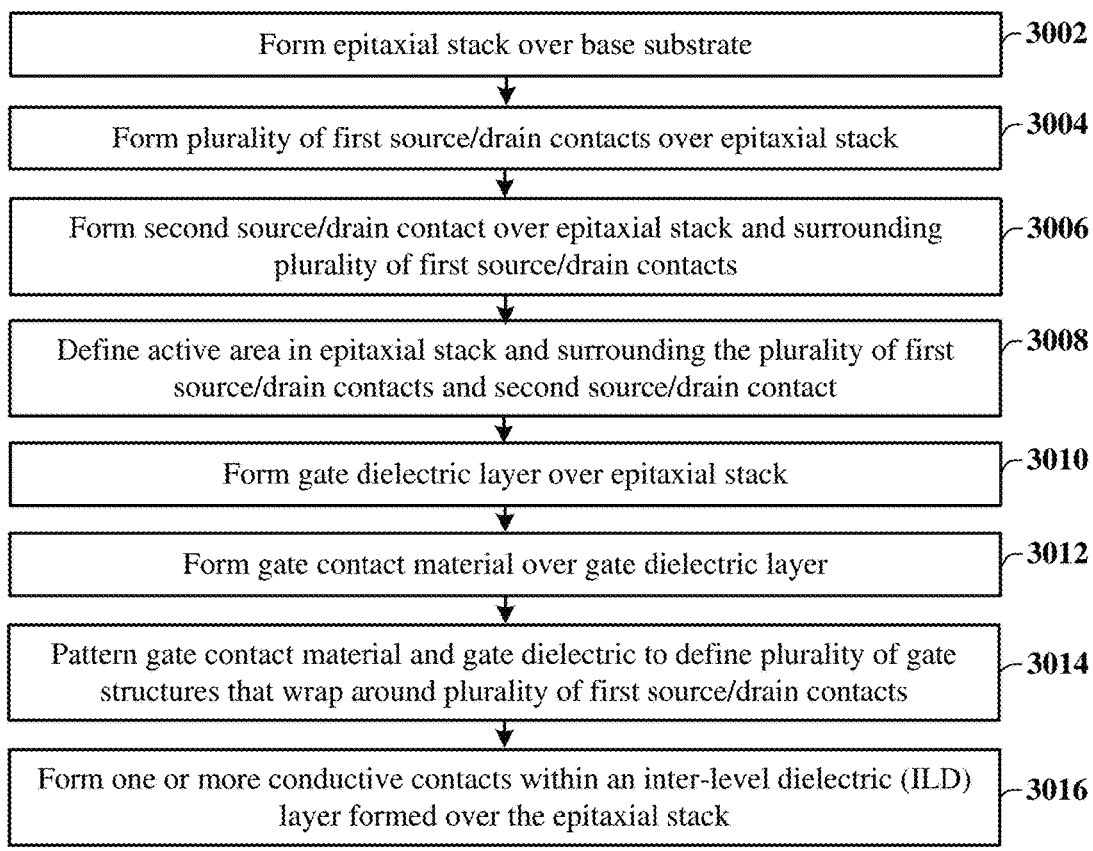
FIG. 30 illustrates a flow diagram of some embodiments of a method of forming an integrated chip having a MISFET device comprising gate structures wrapped around first source/drain contacts.

FIG. 30 illustrates a flow diagram of some embodiments of a method 3000 of forming an integrated chip having a MISFET device comprising gate structures wrapped around first source/drain contacts.

At act 3002, an epitaxial stack is formed over a substrate. The epitaxial stack comprises an active layer and a barrier layer over the active layer. FIGS. 23A-23B illustrate a cross-sectional view 2300 and a top-view 2302 of some embodiments corresponding to act 3002.

At act 3004, a plurality of first source/drain contacts are formed over the epitaxial stack. FIGS. 24A-25B illustrate cross-sectional views, 2400 and 2500, and top-views, 2406 and 2502, of some embodiments corresponding to act 3004.

At act 3006, a second source/drain contact is formed over the epitaxial stack and surrounding the plurality of first source/drain contacts. FIGS. 24A-25B illustrate cross-sectional views, 2400 and 2500, and top-views, 2406 and 2502, of some embodiments corresponding to act 3006.

At act 3008, an active area is defined in the epitaxial stack and surrounding the plurality of first source/drain contacts and the second source/drain contact. FIGS. 26A-26B illustrate a cross-sectional view 2600 and a top-view 2604 of some embodiments corresponding to act 3008.

At act 3010, a gate dielectric layer is formed over the epitaxial stack. FIGS. 27A-27B illustrate a cross-sectional view 2700 and a top-view 2704 of some embodiments corresponding to act 3010.

At act 3012, a gate contact material is formed over the gate dielectric. FIGS. 27A-27B illustrate a cross-sectional view 2700 and a top-view 2704 of some embodiments corresponding to act 3012.

At act 3014, the gate contact material and the gate dielectric layer are patterned to define a plurality of gate structures that wrap around the plurality of first source/drain contacts. FIGS. 28A-28B illustrate a cross-sectional view 2800 and a top-view 2806 of some embodiments corresponding to act 3014.

At act 3016, one or more conductive contacts are formed within an inter-level dielectric (ILD) layer formed over the epitaxial stack. FIG. 29 illustrates a cross-sectional view 2900 of some embodiments corresponding to act 3016.

Accordingly, in some embodiments, the present disclosure relates to a high-voltage transistor device comprising a gate structure that is configured to provide for improved isolation between source/drain contacts. The gate structure wraps around a first source/drain contact and a second source/drain contact that wraps around the gate structure. Because the gate structure is able to disrupt an underlying two-dimensional electron gas (2DEG) within the substrate, having the gate structure wrap around the first source/drain contact disrupts the 2DEG along a closed and unbroken path surrounding the first source/drain contact.

In some embodiments, the present disclosure relates to a transistor device. The transistor device includes a plurality of first source/drain contacts disposed over a substrate; a plurality of gate structures disposed over the substrate between the plurality of first source/drain contacts, the plurality of gate structures wrapping around the plurality of first source/drain contacts in a plurality of closed loops; and a second source/drain contact disposed over the substrate between the plurality of gate structures, the second source/drain contact continuously wrapping around the plurality of gate structures as a continuous structure. In some embodiments, the second source/drain contact includes a plurality of loops having interior sidewalls defining a plurality of openings that respectively surround one of the plurality of first source/drain contacts and one of the plurality of gate structures. In some embodiments, the second source/drain contact includes a plurality of loops respectively defined by a curved sidewall of the second source/drain contact. In some embodiments, the transistor device further includes an isolation region disposed within the substrate and defining an active area, the plurality of first source/drain contacts, the plurality of gate structures, and the second source/drain contact disposed directly over the active area. In some embodiments, the plurality of first source/drain contacts are separated along a first direction; and the active area has a first width and a second width larger than the first width, the first width and the second width measured along a second direction that is perpendicular to the first direction. In some embodiments, the plurality of gate structures are separated along a first direction; and the second source/drain contact continuously extends in the first direction past outermost ones of the plurality of gate structures. In some embodiments, the plurality of first source/drain contacts are source contacts and the second source/drain contact is a drain contact. In some embodiments, the plurality of gate structures include a first gate structure that wraps around a first source/drain contact of the plurality of first source/drain contacts; and the first gate structure continuously extends between a first end disposed along a first side of the first source/drain contact and a second end disposed along the first side of the first source/drain contact, the first end separated from the second end by a non-zero distance. In some embodiments, the substrate includes an active layer disposed over a base substrate; a barrier layer disposed over the active layer, a two-dimensional electron gas (2DEG) being present at an interface of the active layer and the barrier layer; and the plurality of gate structures are configured to disrupt the 2DEG along a plurality of closed paths extending around the plurality of first source/drain contacts. In some embodiments, the second source/drain contact includes a first closed loop surrounding a first gate structure of the plurality of gate structures and a second loop surrounding a second gate structure of the plurality of gate structures; and the second loop does not extend completely around the second gate structure.

In other embodiments, the present disclosure relates to an integrated chip. The integrated chip includes a substrate having an active layer and a barrier layer over the active layer; a plurality of first source/drain contacts disposed over the active layer and separated along a first direction; a plurality of gate structures disposed over the active layer and extending around the plurality of first source/drain contacts along continuous and unbroken paths; and a second source/drain contact that is separated from the plurality of first source/drain contacts by the plurality of gate structures. In some embodiments, the plurality of gate structures include interior sidewalls defining a plurality of openings that extend through the plurality of gate structures and that surround the plurality of first source/drain contacts in closed loops. In some embodiments, the second source/drain contact extends as a continuous structure around the plurality of gate structures. In some embodiments, the second source/drain contact includes a first loop extending completely around a first gate structure of the plurality of gate structures and a second loop that extends part way, but not entirely, around a second gate structure of the plurality of gate structures. In some embodiments, the integrated chip further includes an isolation region disposed within the substrate and defining an active area, the active area having curved edges that are conformal to curved sidewalls of the second source/drain contact. In some embodiments, the active area has a length along the first direction and a width along a second direction that is perpendicular to the first direction, the length larger than the width. In some embodiments, the integrated chip further includes a field plate arranged between the second source/drain contact and a first source/drain contact of the plurality of first source/drain contacts, the field plate extending in a closed loop surrounding the first source/drain contact. In some embodiments, the second source/drain contact includes interior sidewalls defining a plurality of openings extending through the second source/drain contact, the plurality of openings disposed in a first row extending along the first direction and in a second row extending along the first direction and separated from the first row along a second direction that is perpendicular to the first direction.

In yet other embodiments, the present disclosure relates to a method of forming a transistor device. The method includes forming a plurality of first source/drain contacts over a stacked substrate; forming a second source/drain contact over the stacked substrate, the second source/drain contact continuously wrapping around the plurality of first source/drain contacts; and forming a plurality of gate structures over the stacked substrate, the plurality of gate structures laterally between the plurality of first source/drain contacts and the second source/drain contact. In some embodiments, the plurality of gate structures wrap around the plurality of first source/drain contacts along a plurality of continuous and unbroken paths; and the second source/drain contact wraps around the plurality of gate structures along a continuous and unbroken path.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A transistor device, comprising:
a plurality of first source/drain contacts disposed over a substrate;
a plurality of gate structures disposed over the substrate between the plurality of first source/drain contacts, wherein the plurality of gate structures wrap around the plurality of first source/drain contacts in a plurality of closed loops;
a second source/drain contact disposed over the substrate between the plurality of gate structures, wherein the second source/drain contact continuously wraps around the plurality of gate structures as a continuous structure; and
a field plate arranged between the second source/drain contact and a first source/drain contact of the plurality of first source/drain contacts, wherein the field plate extends in a closed loop surrounding the first source/drain contact.

2. The transistor device of claim 1, wherein the second source/drain contact comprises a plurality of loops having interior sidewalls defining a plurality of openings that respectively surround one of the plurality of first source/drain contacts and one of the plurality of gate structures.

3. The transistor device of claim 1, wherein the second source/drain contact comprises a plurality of loops respectively defined by a curved sidewall of the second source/drain contact.

4. The transistor device of claim 1, further comprising:
an isolation region disposed within the substrate and defining an active area, wherein the plurality of first source/drain contacts, the plurality of gate structures, and the second source/drain contact are disposed directly over the active area.

5. The transistor device of claim 4,
wherein the plurality of first source/drain contacts are separated along a first direction; and
wherein the active area has a first width and a second width larger than the first width, the first width and the second width measured along a second direction that is perpendicular to the first direction.

6. The transistor device of claim 1,
wherein the plurality of gate structures are separated along a first direction; and
wherein the second source/drain contact continuously extends in the first direction past outermost ones of the plurality of gate structures.

7. The transistor device of claim 1, wherein the plurality of first source/drain contacts are source contacts and the second source/drain contact is a drain contact.

8. The transistor device of claim 1,
wherein the plurality of gate structures comprise a first gate structure that wraps around a first source/drain contact of the plurality of first source/drain contacts; and
wherein the first gate structure continuously extends between a first end disposed along a first side of the first source/drain contact and a second end disposed along the first side of the first source/drain contact, the first end separated from the second end by a non-zero distance.

9. The transistor device of claim 1, wherein the substrate comprises:
an active layer disposed over a base substrate;
a barrier layer disposed over the active layer, wherein a two-dimensional electron gas (2DEG) is present at an interface of the active layer and the barrier layer; and
wherein the plurality of gate structures are configured to disrupt the 2DEG along a plurality of closed paths extending around the plurality of first source/drain contacts.

10. The transistor device of claim 1,
wherein the second source/drain contact comprises a first closed loop surrounding a first gate structure of the plurality of gate structures and a second loop surrounding a second gate structure of the plurality of gate structures; and
wherein the second loop does not extend completely around the second gate structure.

11. An integrated chip, comprising:
a substrate comprising an active layer and a barrier layer over the active layer;
a plurality of first source/drain contacts disposed over the active layer and separated along a first direction;
a plurality of gate structures disposed over the active layer and extending around the plurality of first source/drain contacts along continuous and unbroken paths, wherein the plurality of gate structures comprise interior sidewalls defining a plurality of openings that extend through the plurality of gate structures and that surround the plurality of first source/drain contacts in closed loops; and a second source/drain contact that is separated from the plurality of first source/drain contacts by the plurality of gate structures, wherein the second source/drain contact comprises interior sidewalls defining a plurality of openings extending through the second source/drain contact, the plurality of openings disposed in a first row extending along the first direction and in a second row extending along the first direction and separated from the first row along a second direction that is perpendicular to the first direction.

12. The integrated chip of claim 11, wherein the second source/drain contact extends as a continuous structure around the plurality of gate structures.

13. The integrated chip of claim 11, wherein the second source/drain contact comprises a first loop extending completely around a first gate structure of the plurality of gate structures and a second loop that extends part way, but not entirely, around a second gate structure of the plurality of gate structures.

14. The integrated chip of claim 11, further comprising:
an isolation region disposed within the substrate and defining an active area, wherein the active area has curved edges that are conformal to curved sidewalls of the second source/drain contact.

15. The integrated chip of claim 14, wherein the active area has a length along the first direction and a width along the second direction, the length larger than the width.

16. The integrated chip of claim 11, further comprising:
a field plate arranged between the second source/drain contact and a first source/drain contact of the plurality of first source/drain contacts, wherein the field plate extends in a closed loop surrounding the first source/drain contact.

17. A method of forming a transistor device, comprising:
forming a plurality of first source/drain contacts over a stacked substrate;
forming a second source/drain contact over the stacked substrate, wherein the second source/drain contact continuously wraps around the plurality of first source/drain contacts as a closed and unbroken structure;
forming a plurality of gate structures over the stacked substrate, wherein the plurality of gate structures are laterally between the plurality of first source/drain contacts and the second source/drain contact; and
wherein the second source/drain contact comprises a first loop extending completely around a first gate structure of the plurality of gate structures and a second loop that extends part way, but not entirely, around a second gate structure of the plurality of gate structures.

18. The method of claim 17,
wherein the plurality of gate structures are separated from one another along a first direction; and
wherein the second source/drain contact has a curved sidewall that laterally extends along the first direction past opposing sides of one of the plurality of gate structures.

19. The method of claim 17, wherein the second source/drain contact has an unbroken top surface that continuously wraps around one or more of the plurality of first source/drain contacts in a closed loop.

20. The method of claim 17, wherein the plurality of first source/drain contacts comprise a drain contact, the second source/drain contact comprises a source contact, and the plurality of gate structures comprise a gate structure, a minimum distance between the gate structure and the drain contact being larger than a minimum distance between the gate structure and the source contact.

* * * * *